United States Patent
Keller

(10) Patent No.: US 7,487,420 B2
(45) Date of Patent: Feb. 3, 2009

(54) SYSTEM AND METHOD FOR PERFORMING LOGIC FAILURE DIAGNOSIS USING MULTIPLE INPUT SIGNATURE REGISTER OUTPUT STREAMS

(75) Inventor: Brion Keller, Birghamton, NY (US)

(73) Assignee: Cadence Design Systems Inc., San Jose, CA (US)

( * ) Notice: Subject to any disclaimer, the term of this patent is extended or adjusted under 35 U.S.C. 154(b) by 120 days.

(21) Appl. No.: 11/355,482

(22) Filed: Feb. 15, 2006

(65) Prior Publication Data

US 2006/0200719 A1 Sep. 7, 2006

Related U.S. Application Data

(60) Provisional application No. 60/652,994, filed on Feb. 15, 2005.

(51) Int. Cl.
*G01R 31/28* (2006.01)
(52) U.S. Cl. .................................................. 714/732
(58) Field of Classification Search ................. 714/732
See application file for complete search history.

(56) References Cited

U.S. PATENT DOCUMENTS

| | | | | |
|---|---|---|---|---|
| 5,184,067 A | * | 2/1993 | Nozuyama | 324/73.1 |
| 5,617,531 A | * | 4/1997 | Crouch et al. | 714/30 |
| 5,631,913 A | * | 5/1997 | Maeda | 714/732 |
| 5,677,916 A | * | 10/1997 | Nozuyama | 714/733 |
| 6,067,651 A | | 5/2000 | Rohrbaugh et al. | |
| 6,327,687 B1 | | 12/2001 | Rajski et al. | |
| 6,557,129 B1 | | 4/2003 | Rajski et al. | |
| 6,611,933 B1 | | 8/2003 | Koenemann et al. | |
| 6,745,359 B2 | * | 6/2004 | Nadeau-Dostie | 714/726 |
| 6,918,074 B2 | * | 7/2005 | Kim et al. | 714/733 |
| 6,950,974 B1 | * | 9/2005 | Wohl et al. | 714/733 |
| 6,993,694 B1 | * | 1/2006 | Kapur et al. | 714/733 |
| 7,093,174 B2 | * | 8/2006 | Fenech Saint Genieys | 714/724 |
| 7,178,078 B2 | * | 2/2007 | Hiraide et al. | 714/739 |
| 7,185,253 B2 | * | 2/2007 | Mitra et al. | 714/734 |
| 7,237,162 B1 | * | 6/2007 | Wohl et al. | 714/726 |

OTHER PUBLICATIONS

Mitra, S., et al., An Efficient Response Compaction Technique For Test Cost Reduction, 2002 IEEE, ITC International Test Conference, 0-7803-7542-4/02.

* cited by examiner

*Primary Examiner*—James C Kerveros
(74) *Attorney, Agent, or Firm*—Orick, Herrington & Sutcliffe LLP

(57) ABSTRACT

A logic failure diagnosis system for performing logic failure diagnosis and methods for manufacturing and using same. The logic failure diagnosis system includes a signature register system and a space compaction system and, during testing, receives data values from a predetermined number of scan chains. During each scan cycle, the signature register system combines a set of data values with a set of recirculated data values to provide a set of data signature values. The signature register system recirculates the data signature values from the preceding scan cycle to provide the recirculated data values. The space compaction system compresses the data signature values to provide a compressed scan chain signature for the scan chains. The compressed scan chain signature can be compared with a set of expected values to determine whether the scan chains include any erroneous values and, if so, to identify a source of the erroneous values.

23 Claims, 11 Drawing Sheets

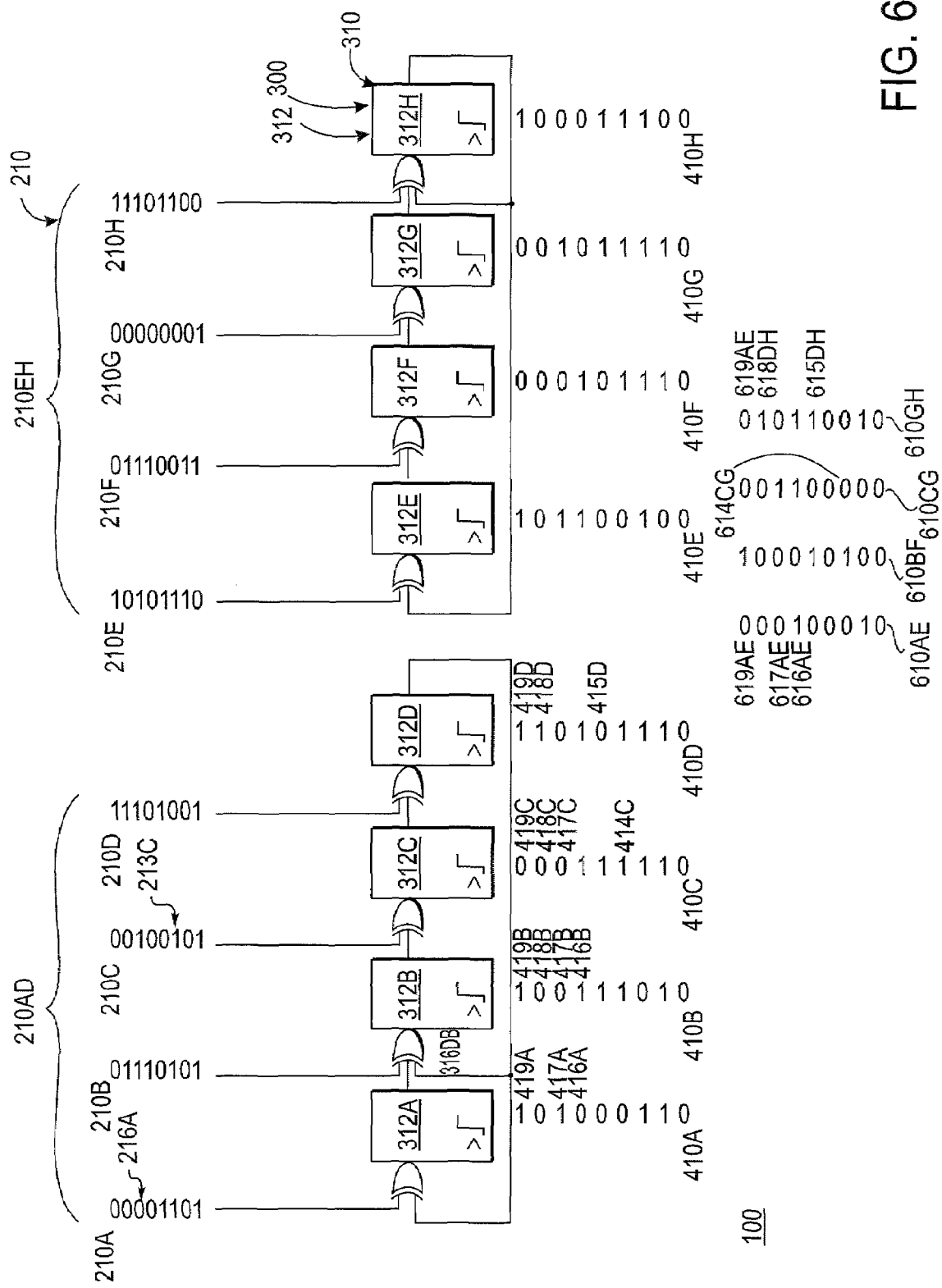

SYSTEM AND METHOD FOR PERFORMING LOGIC FAILURE DIAGNOSIS USING MULTIPLE INPUT SIGNATURE REGISTER OUTPUT STREAMS

CROSS-REFERENCE TO RELATED APPLICATIONS

This application claims priority to a U.S. provisional patent application, Ser. No. 60/652,994, filed on Feb. 15, 2005. Priority to the provisional application is expressly claimed, and the disclosure of the provisional application is hereby incorporated by reference in its entirety.

FIELD

The present invention relates generally to hardware test systems for verifying electronic circuit designs and more particularly, but not exclusively, to interface systems for performing diagnosis of logic failures seen during testing.

BACKGROUND

Compression of test pattern response data into signatures is a well-established technique that has been used for decades, especially for Logic Built-In Self Test (LBIST). More recently it has been used as part of a more general approach for test data compression to save data volume and test time. For example, Cadence Test products available from Cadence Design Systems, Inc., headquartered in San Jose, Calif., use on-product signature compression to reduce both test data volume and test time.

When Multiple Input Signature Registers (MISRs) are used to compress response, data, performing diagnostics using just the failing MISR signatures is impossible. To allow diagnostics to work, the traditional solution is to re-apply a failing test up to the point where the response data would be serially compressed into the MISR, but instead, switch scan configurations so that the internal response data can be fully scanned off chip into the tester for later diagnostic analysis. Although reasonable and used by Cadence for OPMISR, OPMISR+, and SmartBIST compression methods, this approach requires dumping all response bits for a failing test into tester buffers or storing the full set of expected values on the tester and then storing only the observed differences in the tester fail buffer memory. Either way requires the tester to have a large response data repository.

In view of the foregoing, a need exists for an improved system and method for performing logic test failure diagnosis that overcomes the aforementioned obstacles and deficiencies of currently-available hardware test and diagnostic systems.

BRIEF DESCRIPTION OF THE DRAWINGS

FIG. 6A is an exemplary diagram illustrating the operation of the logic failure diagnosis system of FIG. 3A in which the scan chains include two error bits that are provided to the same multiple-input signature register.

Figure 1:
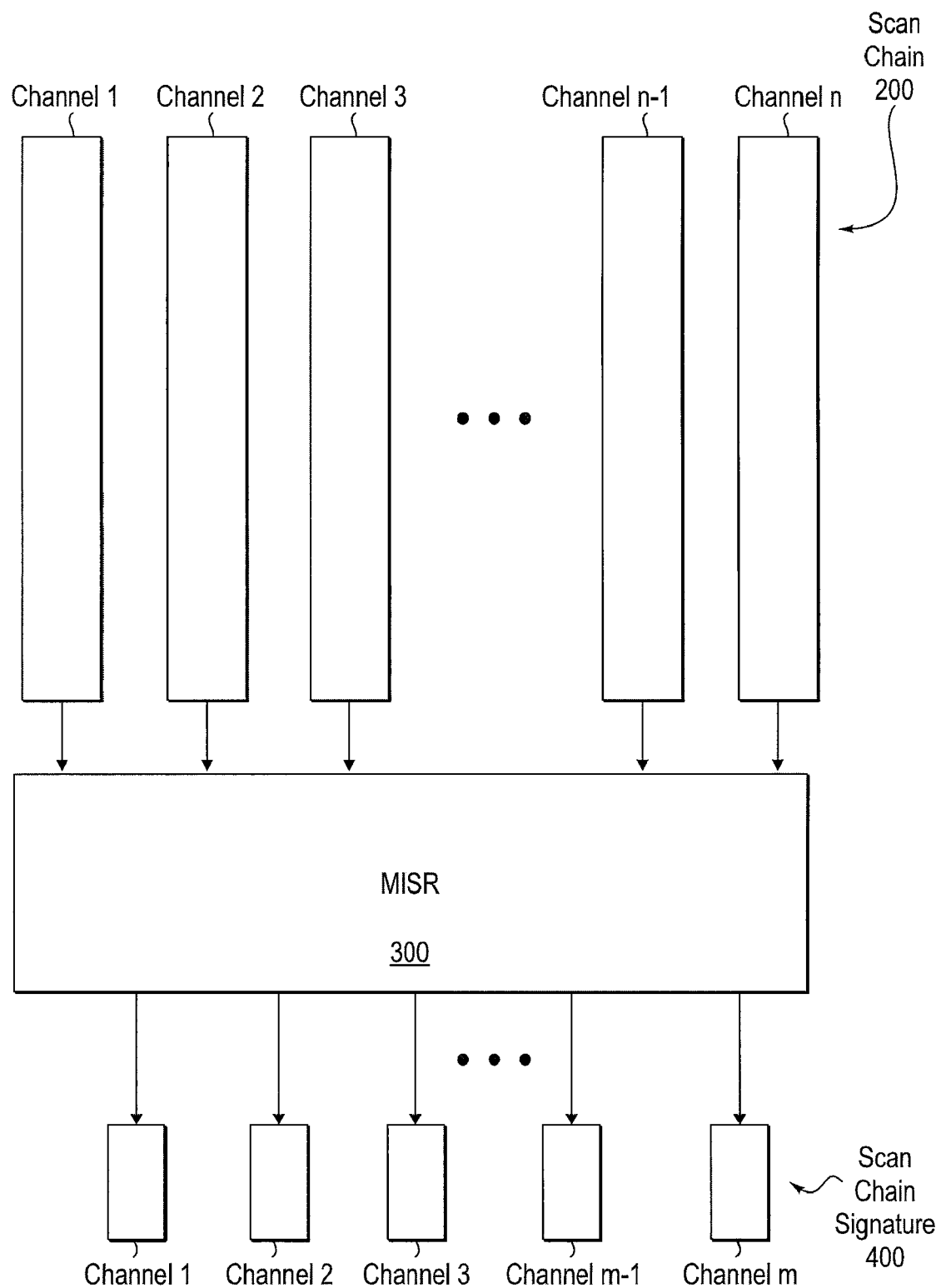
FIG. 1 is an exemplary top-level block diagram illustrating an embodiment of a logic failure diagnosis system in which the logic failure diagnosis system includes a signature register system for converting one or more scan chains into at least one scan chain signature.

It should be noted that the figures are not drawn to scale and that elements of similar structures or functions are generally represented by like reference numerals for illustrative purposes throughout the figures. It also should be noted that the figures are only intended to facilitate the description of the preferred embodiments of the present invention. The figures do not describe every aspect of the present invention and do not limit the scope of the invention.

DETAILED DESCRIPTION OF THE PREFERRED EMBODIMENTS

Since performing logic failure analyses with currently-available hardware test systems requires extensive memory capacity for storing full sets of expected values or all response bits for a failing test during testing for subsequent analysis, a logic failure diagnosis system that observes compacted, composite scan chain signatures during testing can prove desirable and provide a basis for a wide range of system applications, such as automated test equipment (ATE) systems for performing logic failure analysis on electronic circuit designs. This result can be achieved, according to one embodiment disclosed herein, by employing a logic failure diagnosis system 100 as shown in FIG. 1.

Turning to FIG. 1, the logic failure diagnosis system 100 includes a signature register system 300 for receiving one or more scan chains (or channels) 200 and converting the received scan chains 200 into at least one scan chain signature 400. The logic failure diagnosis system 100 is shown in FIG. 1 as receiving a predetermined number n of scan chain channels 200 and providing a predetermined number m of scan chain signature channels 400. Although the numbers n, m each can comprise any suitable numbers, the number m of scan chain signature channels 400 preferably is less than or equal to the number n of scan chain channels 200. Advantageously, the illustrated logic failure diagnosis system 100 can be used to perform Logic Built-In Self Test (LBIST) diagnostics and/or to diagnose failures that appear when Automatic Test Pattern Generation test vectors are applied to a circuit. The logic failure diagnosis system 100 likewise can be used within a partial-good device methodology to identify when the failures being observed are restricted to a small set of units within an integrated circuit chip (not shown). If the integrated circuit chip allows full or reduced functionality when one or more of these units are defective, the logic failure diagnosis system 100 can be applied to identify the failing units.

The scan chains 200 comprise conventional scan chains and can be provided to the signature register system 300 in any suitable manner. For example, the scan chains 200 can be loaded with Automatic Test Pattern Generation test vectors, or from a pseudo-random pattern generator, for application to an electronic circuit design during testing for manufacturing defects. The scan chains 200 preferably are streamed to the signature register system 300 over a predetermined number of scan cycles, greater than or equal to the length of the longest scan chain to ensure all test response bits are seen and compressed.

Figure 2:
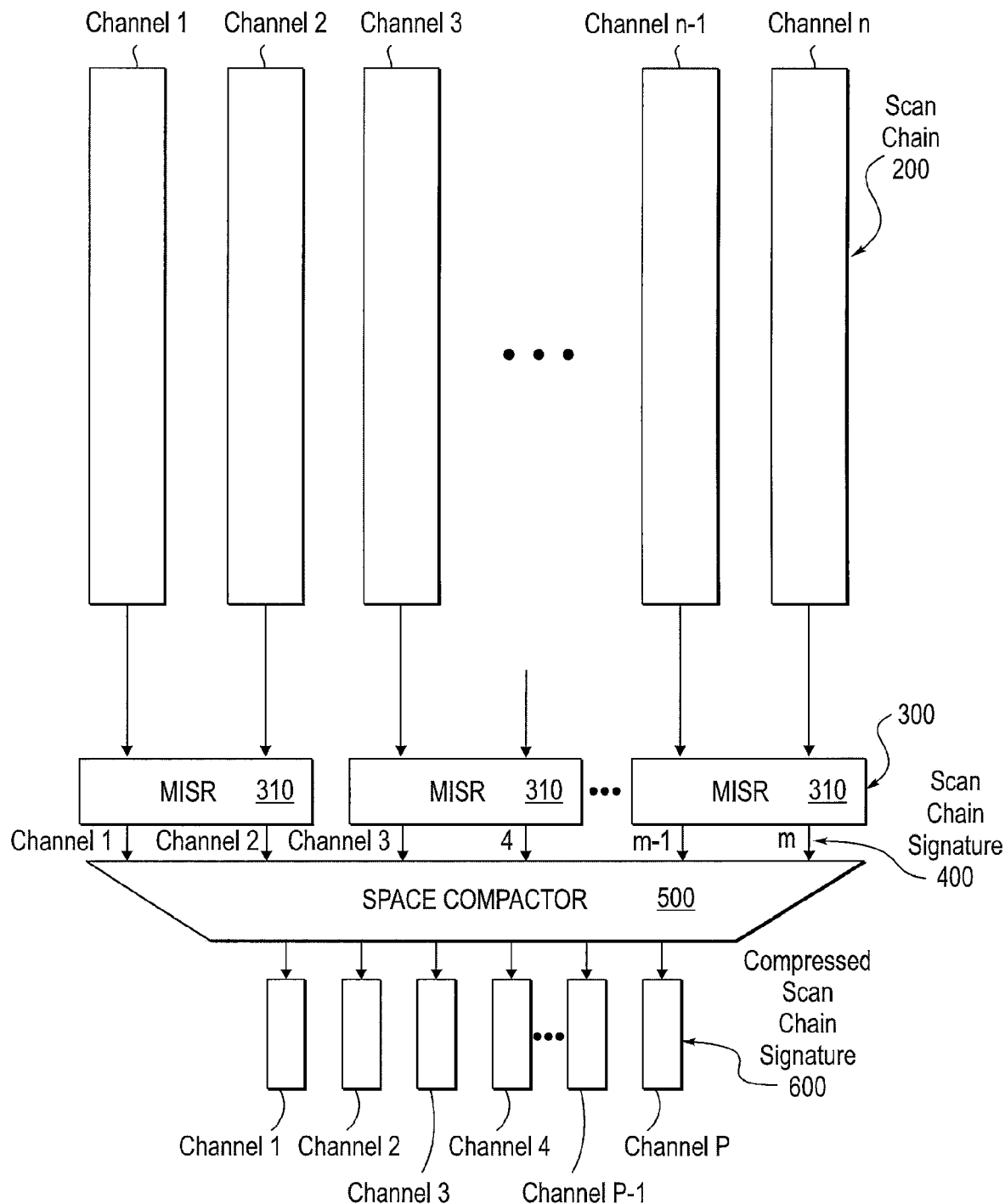
FIG. 2 is an exemplary top-level block diagram illustrating an alternative embodiment of the logic failure diagnosis system of FIG. 1 in which the logic failure diagnosis system further includes a space compaction system for compressing the scan chain signature to provide a compressed scan chain signature.

The signature register system 300 likewise can be provided in any conventional manner and preferably comprises a multiple-input signature register (MISR) system. For example, the signature register system 300 is illustrated in FIG. 2 as comprising a suitable number of multiple-input signature registers 310. Exemplary multiple-input signature registers 310 can include divisor type multiple-input signature registers and multiplier type multiple-input signature registers. The multiple-input signature registers 310 can comprise separate multiple-input signature registers 310 and/or at least partially integrated multiple-input signature registers 310, as desired. Each multiple-input signature register 310 can receive and convert any predetermined number of the scan chains 200 in the manner set forth above, and the number of received scan chains 200 can be uniform and/or different among the multiple-input signature register 310. A typical multiple-input signature register 310 preferably can receive and compress between approximately sixteen and sixty-four scan chains 200, inclusive. For example, the signature register system 300 can include thirty-two 32-bit multiple-input signature registers 310 for converting one thousand twenty-four scan chains 200.

To improve diagnostic resolution when the scan chain signature channels 400 include an erroneous response, it is preferable to utilize a larger number of small multiple-input signature registers 310 rather than a smaller number of large multiple-input signature registers 310. Also, to reduce aliasing when observing the compressed (or composite) scan chain signature 600 (shown in FIG. 2), each bit of the multiple-input signature registers 310 preferably feeds a different output pin of the space compactor 500. The size of the multiple-input signature registers 310 therefore tend to be limited to the number of pins available for observing the compressed scan chain signature 600. The minimum recommended multiple-input signature registers 310 size is approximately sixteen bits to minimize the probability of random failure bits from aliasing within any given multiple-input signature register 310. Note that the probability of randomly appearing failure bits aliasing to the defect-free signature is approximately $\frac{1}{2}^m$, where m is the size of the multiple-input signature register in bits.

Upon receiving the scan chains 200 during testing, the signature register system 300 compresses the scan chains 200 output streams to provide the scan chain signature 400. If provided as a multiple-input signature register system, the signature register system 300 advantageously can capture one or more erroneous responses included in the scan chains 200 and can internally recirculate the erroneous responses continuously during the scan shift response collection at the end of each test in the manner discussed in more detail below with reference to FIGS. 4A-B. The signature register system 300 can provide the scan chain signature 400 for each scan cycle. Thereby, by observing the state of the signature register system 300 and, therefore, the scan chain signature 400 over a plurality of intermediate scan cycles, the source of each erroneous response can be identified, and the underlying failure can be diagnosed.

As desired, the logic failure diagnosis system 100 can include a space compaction system 500 as shown in FIG. 2. Receiving the scan chain signature 400 from the signature register system 300, the space compaction system 500 can compress (or combine) the received scan chain signature 400 data to provide a compressed (or composite) scan chain signature 600. Stated somewhat differently, the space compaction system 500 can reduce the m channels of the scan chain signatures 400 to provide p channels of the compressed (or composite) scan chain signature 600. Although the logic failure diagnosis system 100 can provide any suitable predetermined number p of compressed scan chain signature channels 600, the number p of compressed scan chain signature channels 600 preferably is less than the number m of scan chain signatures channels 400 and, therefore, the number n of scan chains channels 200. By compressing the received scan chain signature 400, the space compaction system 500 reduces the number of chip output pins needed to observe the scan chain signature 400 and reduces the data volume of the scan chain signature 400. Less memory resources thereby are needed to store the compressed scan chain signature 600 than is required in currently-available automated test equipment (ATE) systems.

Figure 3A:
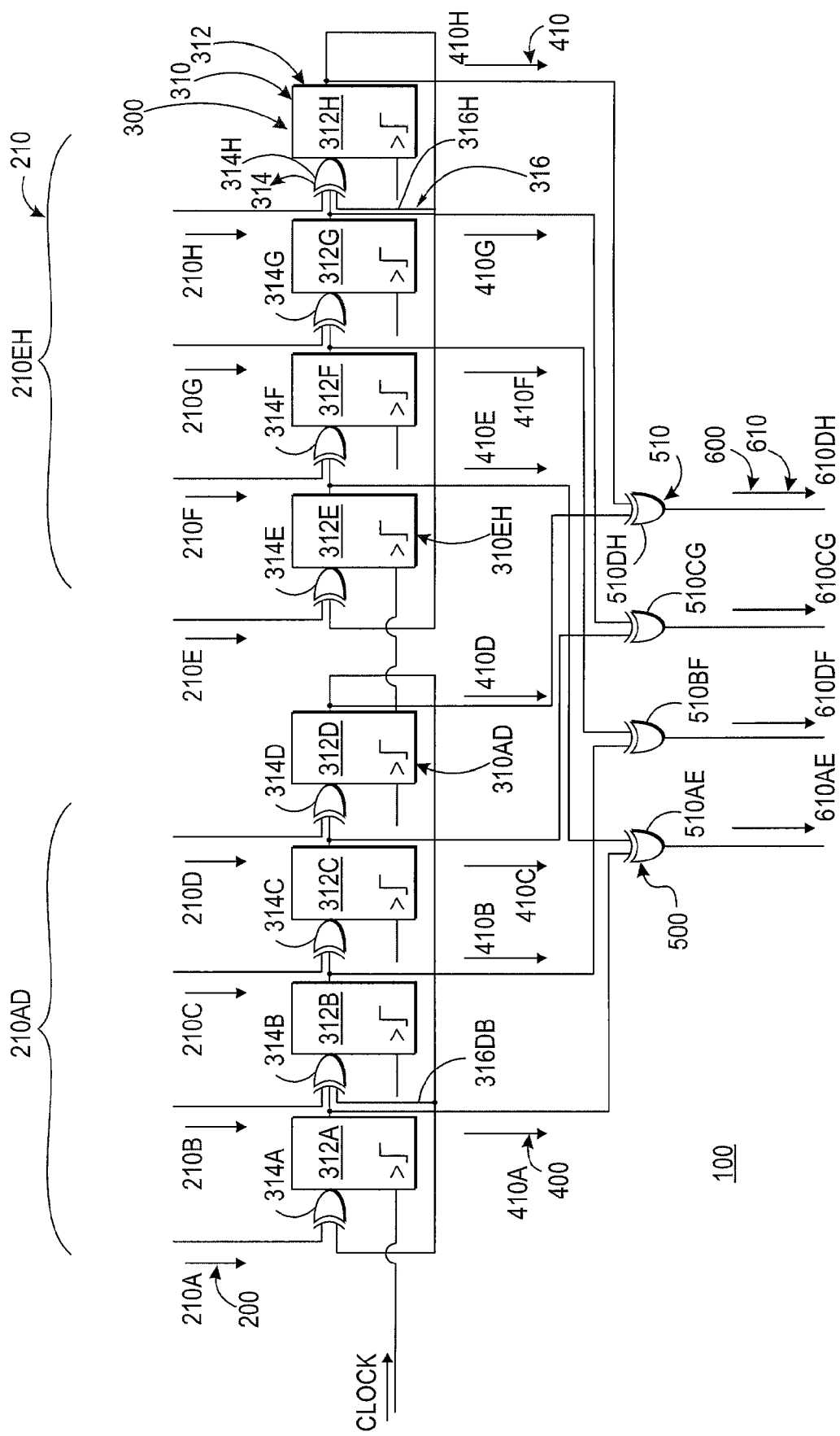
FIG. 3A is an exemplary block diagram illustrating an embodiment of the logic failure diagnosis system of FIG. 2 in which the signature register system comprises a pair of multiple-input signature registers and the space compaction system is provided as a plurality of exclusive-OR trees.
Figure 3B:
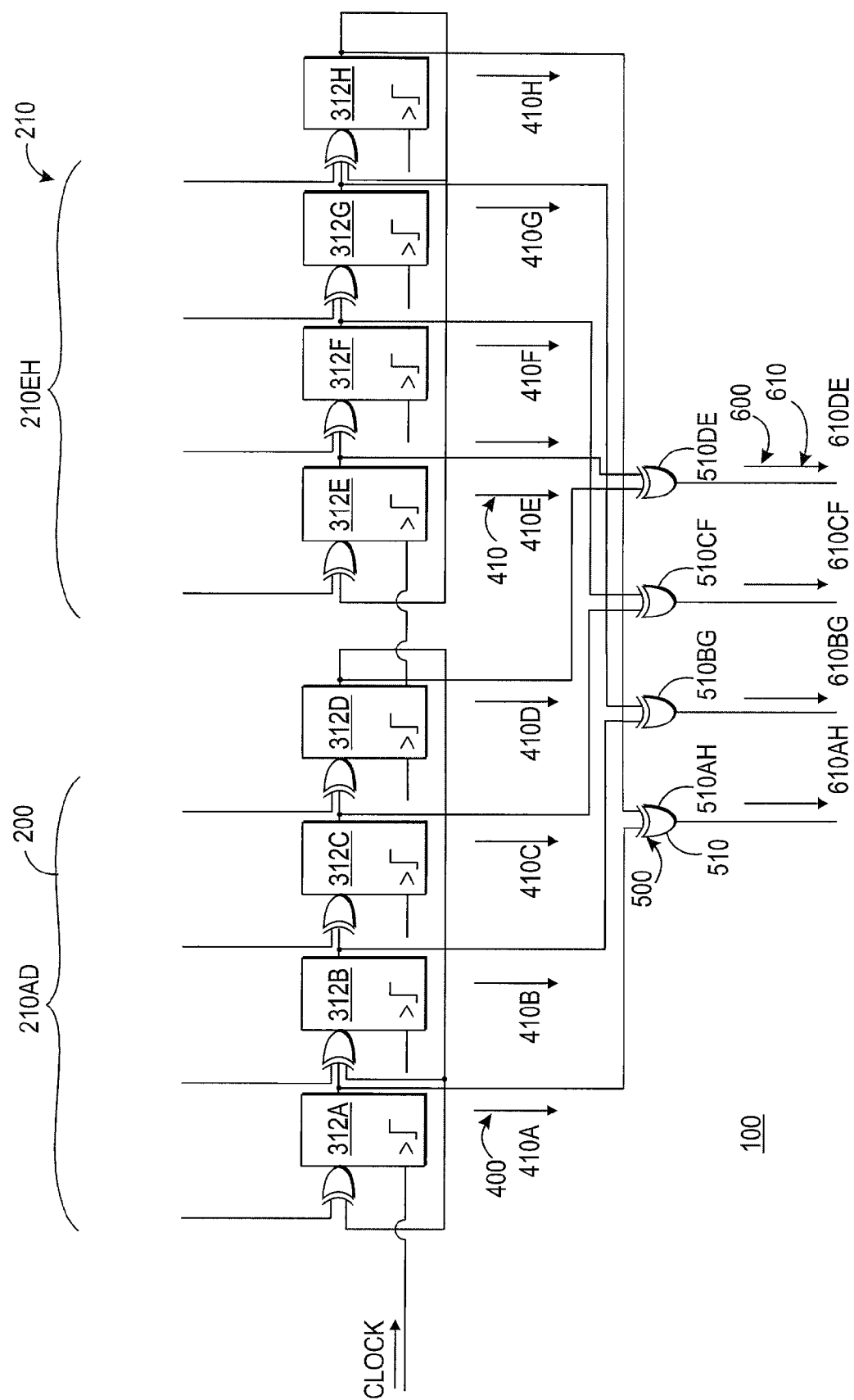
FIG. 3B is an exemplary block diagram illustrating an alternative embodiment of the logic failure diagnosis system of FIG. 3B.

The space compaction system 500 can be provided in any conventional manner and preferably comprises a combinatorial logic linear compaction system. For example, the space compaction system 500 can include a plurality of exclusive-OR trees 510 (shown in FIGS. 3A-B). Being coupled with one or more selected multiple-input signature registers 310, each exclusive-OR tree 510 receives selected scan chain signature channels 400 provided by the associated multiple-input signature registers 310 for each scan cycle during testing. Each of the exclusive-OR trees 510 performs the exclusive-OR operation on the selected scan chain signature channels 400, and the plurality of exclusive-OR trees 510 provides the result of the exclusive-OR operation as the compressed scan chain signature 600. In a preferred embodiment, each XOR tree should not be fed the same corresponding bit from each multiple-input signature register as is shown in FIG. 3A and instead should have a somewhat random selection of which bit to include from each multiple-input signature register, as shown in FIG. 3B. The scan chain signatures 400 thereby can be compacted into the compressed scan chain signature 600 in a manner that facilitates identification of the source of each erroneous response while inhibiting error cancellation and reducing system memory requirements.

Illustrative logic failure diagnosis systems 100 are shown in FIGS. 3A-B. Turning to FIG. 3A, the logic failure diagnosis system 100 is shown as including a signature register system 300 that is provided as a multiple-input signature register (MISR) system comprising a pair of four-bit multiple-input signature registers 310AD, 310EH. Each multiple-input signature register 310AD, 310EH is illustrated as being formed from a plurality of conventional latch (or flip-flop) circuits 312 that are provided in a ring configuration and that are synchronized via a common clock signal CLOCK. For example, the first multiple-input signature register 310AD includes a sequence of latch circuits 312A, 312B, 312C, 312D, wherein the output port of a selected latch circuit 312 is coupled with the input port of the succeeding latch circuit 312 in the sequence. The output port of the latch circuit 312B therefore is shown as being coupled with the input port of the latch circuit 312C. As illustrated in FIG. 3A, the latch circuits 312A, 312B, 312C, 312D can be directly coupled and/or indirectly coupled via one or more intermediate components, such as an exclusive-OR (XOR) circuit 314.

FIG. 3A shows the logic failure diagnosis systems 100 as being configured to receive and convert exemplary scan chains 200 that comprise eight scan chain channels 210A-H. Each multiple-input signature register 310 is associated with a plurality of selected channels 210 of the scan chains 200. The multiple-input signature register 310AD, for example, is shown as being associated with selected channels 210AD of the scan chain 200; whereas, the multiple-input signature register 310EH is associated with selected channels 210EH. The selected channels 210 likewise are provided to a predetermined latch circuit 312 within the associated multiple-input signature register 310. Therefore, within each multiple-input signature register 310, each exclusive-OR circuit 314 is illustrated as having first and second input ports as well as an output port that is coupled with the input port of a relevant latch circuit 312. The first input port is coupled with, and configured to receive, the relevant scan chain channel 210A-H, and the second input port is coupled with the output port of the preceding latch circuit 312 in the sequence.

The first multiple-input signature register 310AD, for example, is shown as including four exclusive-OR circuits 314A, 314B, 314C, 314D. Turning to the exclusive-OR circuit 314C, the exclusive-OR circuit 314C is illustrated as being a two-input exclusive-OR circuit. Being disposed between the latch circuit 312B and the latch circuit 312C, the exclusive-OR circuit 314C has a first input port that is coupled with the output port of the preceding latch circuit 312B and an output port that is coupled with the input port of the succeeding latch circuit 312C. The second input port of the exclusive-OR circuit 314C is coupled with, and configured to receive, channel 210C of the scan chain 200.

Similarly, the exclusive-OR circuit 314D likewise is a two-input exclusive-OR circuit and is disposed between the latch circuit 312C and the latch circuit 312D of the first multiple-input signature register 310AD. Having an output port that is coupled with the input port of the succeeding latch circuit 312D, the exclusive-OR circuit 314D includes a first input port that is coupled with the output port of the preceding latch circuit 312C and a second input port that is coupled with the output port of the preceding latch circuit 312B. The first multiple-input signature register 310AD thereby can receive, and internally recirculate, the associated channels 210AD of the scan chains 200. The second multiple-input signature register 310EH likewise can be provided in the manner set forth above with reference to the first multiple-input signature register 310AD and is illustrated as receiving, and internally recirculating, channels 210EH of the scan chains 200.

As desired, at least one of the multiple-input signature registers 310AD, 310EH can include one or more feedback taps 316. Each feedback tap 316 provides an additional communication path in the ring configuration formed by the latch circuits 312. The relevant multiple-input signature register 310 thereby has any additional communication path for internally recirculating the associated channels 210 of the scan chains 200. Stated somewhat differently, a feedback tap 316 can be included in a selected multiple-input signature register 310 to form a sub-ring configuration among the latch circuits 312. The use of feedback taps 316 permits each multiple-input signature register 310 comprising the signature register system 300 to be configured with a unique recirculation characteristic (or signature) by which the associated channels 210 are internally recirculated. Therefore, if the scan chain 200 includes an erroneous response, the manner by which the erroneous response is recirculated will differ among the multiple-input signature registers 310. The multiple-input signature register 310 that is circulating the erroneous response thereby can be identified, and the underlying failure diagnosed, by observing the erroneous response over a plurality of scan cycles.

As shown in FIG. 3A, the first multiple-input signature register 310AD can include a feedback tap 316DB. The feedback tap 316DB couples the output port of the latch circuit 312D with a third input port of the exclusive-OR circuit 314B. In the manner set forth above, the exclusive-OR circuit 314B has an output port that is coupled with the input port of the latch circuit 312B. Therefore, in addition to a first ring configuration formed by the latch circuits 312A, 312B, 312C, 312D, the first multiple-input signature register 310AD includes a second ring configuration (or sub-ring configuration) formed by the latch circuits 312B, 312C, 312D as illustrated in FIG. 3A. The feedback tap 316DB thereby configures the first multiple-input signature register 310AD with a unique recirculation characteristic by which the associated channels 210AD can be internally recirculated.

Since the feedback tap 316DB configures the first multiple-input signature register 310AD with a unique recirculation characteristic, the recirculation characteristics of the multiple-input signature registers 310AD, 310EH are different. In other words, the use of a feedback tap 316 with the second multiple-input signature register 310EH can be optional. The second multiple-input signature register 310EH is shown in FIG. 3A as including a feedback tap 316HH. The feedback tap 316HH can be provided in the manner set forth above with reference to the feedback tap 316DB and is illustrated as coupling the output port and the input port of the latch circuit 312H via the exclusive-OR circuit 314H. As shown in FIG. 3A, the second multiple-input signature register 310EH therefore includes a first ring configuration formed by the latch circuits 312E, 312F, 312G, 312H and a second ring configuration (or sub-ring configuration) formed by the latch circuit 312H. Thereby, the second multiple-input signature register 310EH likewise is configured with a unique recirculation characteristic by which the associated channels 210EH can be internally recirculated.

By providing unique recirculation characteristics to each multiple-input signature register 310, the signature register system 300 can generate at least one scan chain signature 400. In the manner discussed in more detail above with reference to FIG. 1, the scan chain signatures 400 can include a plurality of scan chain signature channels 410. FIG. 3A shows that the scan chain signature channels 410 comprising the scan chain signature 400 can be derived from the output ports of the multiple-input signature registers 310. As illustrated by the exemplary logic failure diagnosis system 100 of FIG. 3, the signature register system 300 can be configured to provide exemplary scan chain signatures 400 that comprise eight scan chain signature channels 410A-H. The scan chain signature channels 410A, 410B, 410C, 410D can be provided by the first multiple-input signature register 310AD; whereas, the second multiple-input signature register 310EH can provide the scan chain signature channels 410E, 410F, 410G, 410H. Turning to the first multiple-input signature register 310AD, for example, the scan chain signature channels 410A, 410B, 410C, 410D can be respectively derived from the output ports of the multiple-input signature registers 310A, 310B, 310C, 310D. The output ports of the multiple-input signature registers 310E, 310F, 310H, 310H likewise are illustrated as providing the scan chain signature channels 410E, 410F, 410G, 410H.

The exemplary logic failure diagnosis system 100 of FIG. 3A is shown as including a space compaction system 500 for compressing the scan chain signature 400. The space compaction system 500 thereby can provide the compressed (or composite) scan chain signature 600 as set forth above with reference to FIG. 2. In other words, the space compaction system 500 can receive the scan chain signature channels 410 from the signature register system 300 and can compress the scan chain signature channels 410 to provide one or more compressed scan chain signature channels 610 of the compressed scan chain signature 600. As illustrated in FIG. 3A, the space compaction system 500 can be provided as a linear compaction system, including a plurality of exclusive-OR trees 510. The space compaction system 500 is shown as comprising four exclusive-OR trees 510AE, 510BF, 510CG, 510DH. Each exclusive-OR tree 510AE, 510BF, 510CG, 510DH is provided as a two-input exclusive-OR circuit for purposes of illustration.

The space compaction system 500 is coupled with, and configured to communicate with, the signature register system 300. Turning to the exclusive-OR tree 510AE, the exclusive-OR tree 510AE has a first input port that is coupled with the output port of the latch circuit 312A of the first multiple-input signature register 310AD and a second input port that is coupled with the output port of the latch circuit 312E of the second multiple-input signature register 310EH. The exclusive-OR tree 510AE thereby can receive the scan chain signature channel 410A and the scan chain signature channel 410E. Upon performing the exclusive-OR operation on the scan chain signature channels 410A, 410E, the exclusive-OR tree 510AE can provide the result of the exclusive-OR operation as the compressed scan chain signature channel 610AE as shown in FIG. 3A. The space compaction system 500 thereby can compress the scan chain signature channels 410A, 410E and provide the compressed scan chain signature channel 610AE.

The exclusive-OR tree 510BF of FIG. 3A similarly has a first input port that is coupled with the output port of the latch circuit 312B of the first multiple-input signature register 310AD and a second input port that is coupled with the output port of the latch circuit 312F of the second multiple-input signature register 310EH. Thereby, the exclusive-OR tree 510BF can receive and compress the scan chain signature channels 410B, 410F and can provide the compressed scan chain signature channel 610BF as shown in FIG. 3A. The exclusive-OR trees 510CG, 510DH likewise can be coupled with the latch circuits 312C, 312G and the latch circuits 312D, 312H and can receive the scan chain signature channels 410C, 410G and the scan chain signature channels 410D, 410H, respectively. In the manner set forth above with reference to the exclusive-OR trees 510AD, 510BF, the exclusive-OR trees 510CG, 510DH can respectively compress the scan chain signature channels 410C, 410G and the scan chain signature channels 410D, 410H to provide the compressed scan chain signature channels 610CG, 610DH. The space compaction system 500 thereby can provide the compressed scan chain signature channels 610AD, 610BE, 610CG, 610DH as the compressed scan chain signature 600.

Although shown and described as comprising a pair of four-bit multiple-input signature registers 310AD, 310EH for purposes of illustration only, the logic failure diagnosis system 100 can include any appropriate type of signature register system 300 for converting scan chains 200 into scan chain signatures 400. For example, the signature register system 300 can include any suitable number of multiple-input signature registers 310, each provided with any conventional construction and adapted to receive any predetermined number of scan chain channels 210. The logic failure diagnosis system 100 likewise can include any conventional type of space compaction system 500 for compressing the scan chain signature 400 to provide the compressed scan chain signature 600 and is not limited to two-input exclusive-OR trees 510AE, 510BF, 510CG, 510DH as illustrated in FIG. 3A. In other words, if the space compaction system 500 comprises a plurality of exclusive-OR trees 510, the exclusive-OR trees 510 can have any preselected number of inputs for receiving selected scan chain signature channels 410.

The signature register system 300 and the space compaction system 500 likewise can be coupled, and configured to communicate, in any conventional manner. Therefore, the signature register system 300 and the space compaction system 500 are not limited to being coupled in the manner shown and described above with reference to FIG. 3A. Turning to FIG. 3B, for example, the space compaction system 500 can comprise a linear compaction system, comprising four exclusive-OR trees 510AH, 510BG, 510CF, 510DE. Each of the exclusive-OR trees 510AH, 510BG, 510CF, 510DE can be provided in the manner set forth in more detail above with reference to the exclusive-OR trees 510AE, 510BF, 510CG, 510DH (shown in FIG. 3A). By including the space compaction system 500, the logic failure diagnosis system 100 can be advantageously configured to send corresponding outputs from each multiple-input signature register to different compactor outputs and in a different mapping order.

In the manner discussed above regarding the exclusive-OR trees 510 (shown in FIG. 3A), the exclusive-OR tree 510AH has a first input port that is coupled with the output port of the latch circuit 312A of the first multiple-input signature register 310AD and a second input port that is coupled with the output port of the latch circuit 312H of the second multiple-input signature register 310EH. The exclusive-OR tree 510AE thereby can receive the scan chain signature channel 410A and the scan chain signature channel 410H. Upon performing the exclusive-OR operation on the scan chain signature channels 410A, 410H, the exclusive-OR tree 510AH can provide the result of the exclusive-OR operation as the compressed scan chain signature channel 610AH as shown in FIG. 3B. The space compaction system 500 thereby can compress the scan chain signature channels 410A, 410H and provide the compressed scan chain signature channel 610AH.

The exclusive-OR tree 510BG of FIG. 3B similarly has a first input port that is coupled with the output port of the latch circuit 312B of the first multiple-input signature register 310AD and a second input port that is coupled with the output port of the latch circuit 312G of the second multiple-input signature register 310EH. Thereby, the exclusive-OR tree 510BG can receive and compress the scan chain signature channels 410B, 410G and can provide the compressed scan chain signature channel 610BG as shown in FIG. 3B. The exclusive-OR trees 510CF, 510DE likewise can be coupled with the latch circuits 312C, 312F and the latch circuits 312D, 312E and can receive the scan chain signature channels 410C, 410F and the scan chain signature channels 410D, 410E, respectively. In the manner set forth above, the exclusive-OR trees 510CF, 510DE can respectively compress the scan chain signature channels 410C, 410F and the scan chain signature channels 410D, 410E to provide the compressed scan chain signature channels 610CF, 610DE. The space compaction system 500 thereby can provide the compressed scan chain signature channels 610AD, 610BE, 610CG, 610DH as the compressed scan chain signature 600 in the manner discussed in more detail above.

Figure 4A:
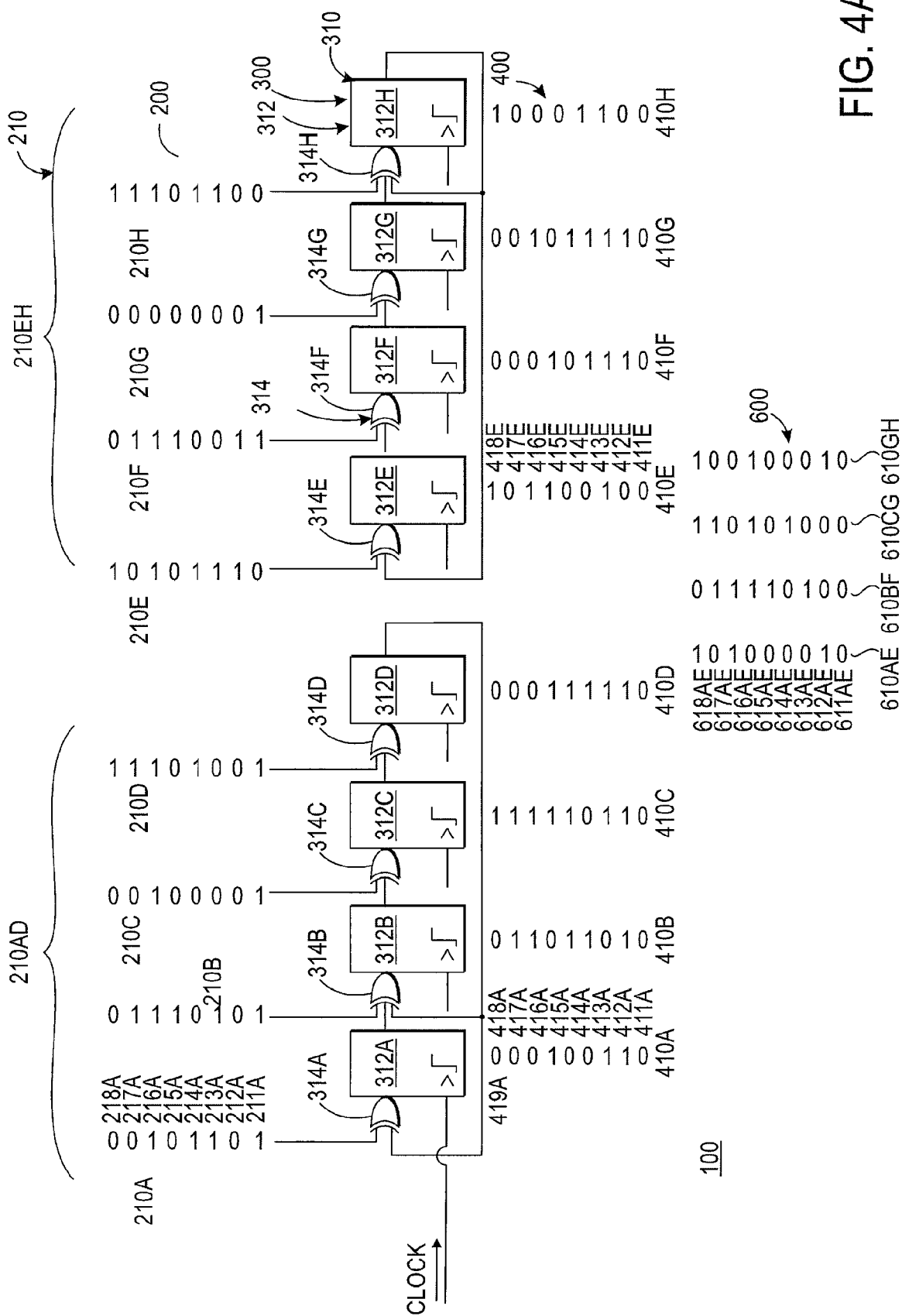
FIG. 4A is an exemplary diagram illustrating the operation of the logic failure diagnosis system of FIG. 3A in which the logic failure diagnosis system receives and processes scan chains that represent a passing test.
Figure 4B:
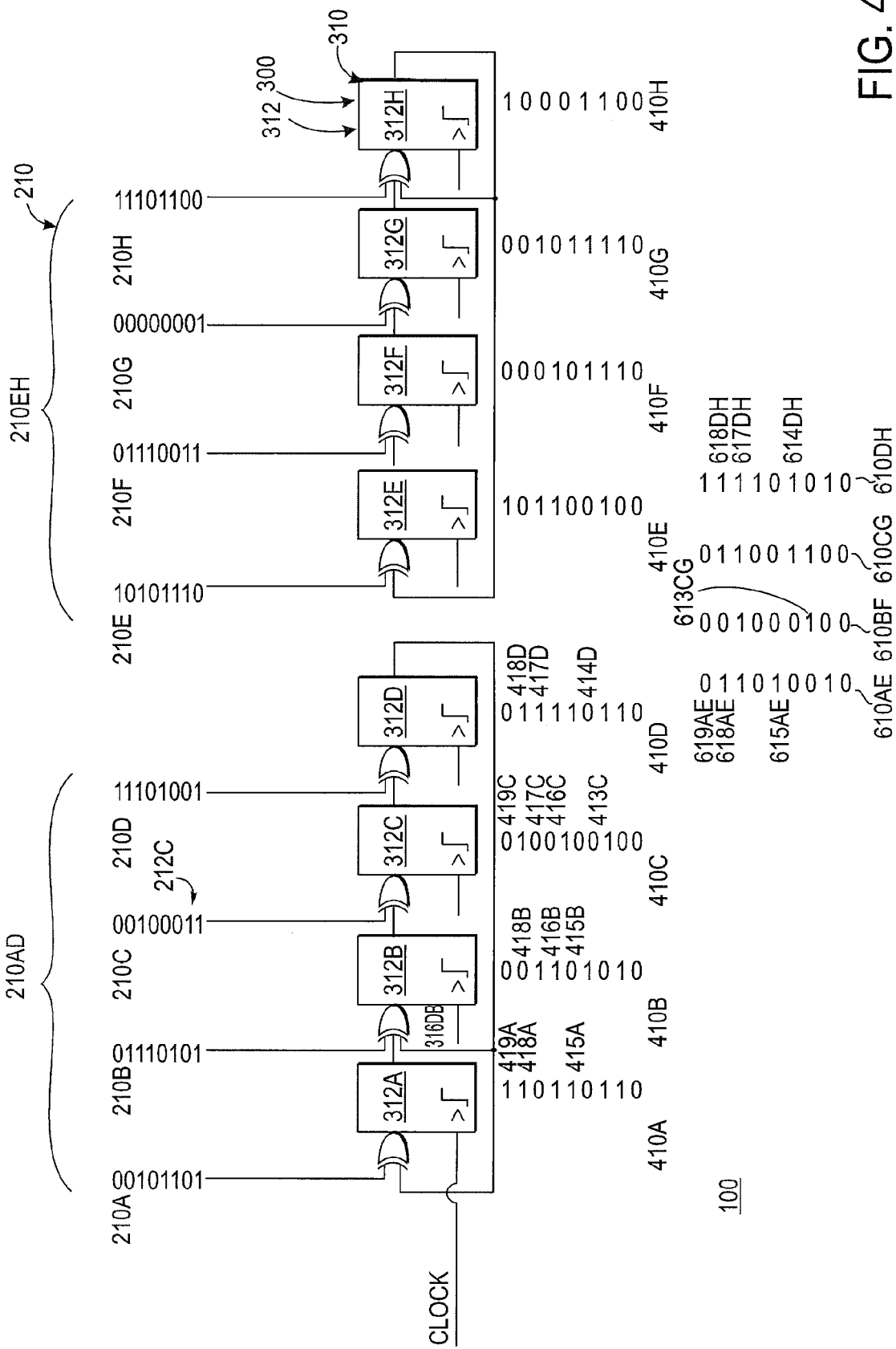
FIG. 4B is an exemplary diagram illustrating the operation of the logic failure diagnosis system of FIG. 3A in which the scan chains include an error bit.

The operation of the exemplary logic failure diagnosis system 100 of FIG. 3A is illustrated and described with reference to FIGS. 4A-B. For purposes of clarity, the space compaction system 500 (shown in FIG. 3) has been omitted from the exemplary logic failure diagnosis system 100 shown in FIGS. 4A-B. The signature register system 300 likewise is shown as being initialized to a predetermined state. Although the signature register system 300 can be initialized in any conventional manner, the multiple-input signature registers 310AD, 310EH are illustrated in FIGS. 4A-B as being initialized to provide all zeroes at the output ports of the latch circuits 312A-H. The signature register system 300 thereby can provide an initial scan chain signature 411A-H with the value of "00000000" prior to scanning the data from the scan chains into the multiple-input signature registers.

The logic failure diagnosis system 100 is shown as receiving the scan chain channels 210A-H. Each scan chain channel 210A-H is shown as comprising eight sets of scan chain bits 211A-H, 212A-H, . . . , 218A-H, which are sequentially provided to the signature register system 300 over a time interval of eight scan cycles. In other words, one set of the scan chain bits 211A-H, 212A-H, . . . , 218A-H is provided to the input port of the corresponding latch circuit 312A-H during each scan cycle. The scan chain channels 210A-H therefore provide the first set of scan chain bits 211A-H during the first scan cycle and the second set of scan chain bits 212A-H during the second scan cycle. During the scan shifting of each test's response, the scan chain channels 210A-H continue to sequentially provide sets of scan chain bits 211A-H, 212A-H, . . . , 218A-H to the latch circuit 312A-H until the last scan cycle, here the eighth scan cycle, wherein the scan chain channels 210A-H provide the eighth set of scan chain bits 218A-H.

As shown in FIG. 4A, for example, the scan chain bits 211A, 212A, . . . , 218A of the scan chain channel 210A can comprise the sequence "00101101." During the first scan cycle of the logic failure diagnosis system 100, the scan chain channel 210A provides the first scan chain bit 211A with a value of "1" to the input port of the latch circuit 312A. The second scan chain bit 212A with a value of "0" thereafter is provided to the latch circuit 312A during the second scan cycle, and the third scan chain bit 211A with a value of "1" is provided to the latch circuit 312A during the third scan cycle. The scan chain channel 210A can continue to sequentially provide the scan chain bits 211A, 212A, . . . , 218A to the latch circuit 312A until the eighth scan cycle during which the scan chain channel 210A provides the eighth scan chain bit 218A with a value of "0." Each scan chain channel 210A-H provides the associated set of scan chain bits 211A-H, 212A-H, . . . , 218A-H to the corresponding latch circuit 312A-H in the manner set forth above.

FIG. 4A illustrates the operation of the logic failure diagnosis system 100 when the scan chain channels 210A-H provide the scan chain bits 211A-H, 212A-H, . . . , 218A-H with "good" values. In other words, the scan chain bits 211A-H, 212A-H, . . . , 218A-H each comprise the expected values of the scan chain channels 210A-H when the source of the scan chain channels 210A-H passes a selected manufacturing test. The signature register system 300 can receive and convert the scan chain bits 211A-H, 212A-H, . . . , 218A-H into the scan chain signature channels 410. The scan chain signature channels 410 is shown in FIG. 4A as comprising a sequence of nine sets of scan chain signature bits 411A-H, 412A-H, . . . , 419A-H, wherein the scan chain signature 411A-H comprises the initialized state of the signature register system 300. As desired, the sets of scan chain signature bits 411A-H, 412A-H, . . . , 419A-H can be stored in test equipment memory (not shown), for comparing the results from subsequent application of the selected test to different devices being tested, such as each chip on a silicon wafer. The results from the subsequent test can be compared with the expected values included in the tester memory. Any erroneous response in the results thereby can be readily identified, and the source of the underlying failure can be diagnosed.

Being initialized to the scan chain signature 411A-H, the signature register system 300 can receive the first set of scan chain bits 211A-H during -the first scan cycle as illustrated in FIG. 4A. Turning to the first multiple-input signature register 310AD, for example, the output ports of the latch circuits 312A-D are shown as being initialized to the scan chain signature 411A-D with a value of "0000." The scan chain bits 211A-D with a value of "1111" therefore are provided without modification to the input ports of the latch circuits 312A-D via the exclusive-OR (XOR) circuits 314A-D. During the first scan cycle, the latch circuits 312A-D receive the scan chain bits 211A-D and thereby provide the scan chain signature 412A-D with a value of "1111" as shown in FIG. 4A.

During the second scan cycle, the scan chain bits 212A-D with a value of "0000" are provided to the input ports of the respective exclusive-OR circuits 314A-D. The scan chain signature 412A-D with a value of "1111" is recirculated within the first multiple-input signature register 310AD and likewise is provided to the input ports of the respective exclusive-OR circuits 314A-D. In the manner set forth in more detail above with reference to FIG. 3A, the feedback tap 316DB provides the first multiple-input signature register 310AD with the unique recirculation characteristic for recirculating the scan chain signature 412A-D. Upon performing the exclusive-OR operations on the respective scan chain bits 212A-D and the scan chain signature 412A-D in accordance with the unique recirculation characteristic, the exclusive-OR circuits 314A-D can provide the results of the exclusive-OR operations to the input ports of the latch circuits 312A-D. The latch circuits 312A-D of FIG. 4A therefore as illustrated as providing the scan chain signature 413A-D with a value of "1011."

In the manner discussed in more detail above, the first multiple-input signature register 310AD can continue to receive the scan chain bits 211A-D, 212A-D, . . . , 218A-D provided by the scan chain channels 210AD for the remaining scan cycles. During each scan cycle, the first multiple-input signature register 310AD likewise can continue to recirculate the scan chain signatures 411A-D, 412A-D, . . . , 419A-D in accordance with the unique recirculation characteristic. The first multiple-input signature register 310AD thereby can provide the sets of scan chain signature bits 411A-H, 412A-H, . . . , 419A-H as set forth above. Similarly, the second multiple-input signature register 310EH can receive the scan chain bits 211E-H, 212E-H, . . . , 218E-H and provide the scan chain signatures 411E-H, 412E-H, . . . , 419E-H, recirculating the scan chain signatures 411E-H, 412E-H, ..., 419E-H in accordance with the unique recirculation characteristic of the second multiple-input signature register 310EH. The signature register system 300 thereby can provide the scan chain signatures 411A-H, 412A-H, ..., 419A-H as shown in FIG. 4A.

As desired, the scan chain signatures 411A-H, 412A-H, ..., 419A-H of the scan chain signature 400 can be compressed to form the compressed scan chain signature 600 as set forth above. FIG. 4A shows an exemplary compressed scan chain signature 600 that comprises four compressed scan chain signature channels 610AE, 610BF, 610CG, 610DH. The compressed scan chain signature channels 610AE, 610BF, 610CG, 610DH can be formed by providing the scan chain signatures 411A-H, 412A-H, ..., 419A-H to a space compaction system 500 during testing. If the scan chain signatures 411A-H, 412A-H, ..., 419A-H are provided to the space compaction system 500 shown in FIG. 3A, for example, the scan chain signature 410A and the scan signature 410E can be provided to the exclusive-OR tree 510AE (shown in FIG. 3A) over the eight scan cycles. Similarly, the scan chain signatures 410B, 410F and the scan signatures 410C, 410G can be respectively provided to the exclusive-OR trees 510BF, 510CG (each shown in FIG. 3A); whereas, the scan chain signature 410D and the scan signature 410H can be provided to the exclusive-OR tree 510DH (shown in FIG. 3A) in the manner discussed above.

Turning to the exclusive-OR tree 510AE, the latch circuit 312A can provide the scan chain signature 411A to the first input port of the exclusive-OR tree 510AE; whereas, the latch circuit 312E can provide the scan chain signature 411E to the second input port of the exclusive-OR tree 510AE in the manner discussed in more detail above with reference to FIG. 3A. As discussed above, the scan chain signature 411A and the scan signature 411E each can be initialized to the value of "0." The exclusive-OR tree 510AE can compress the scan chain signatures 411A, 411E by performing the exclusive-OR operation on the scan chain signatures 411A, 411E to provide the compressed scan chain signature 611AE with the value of "0" as illustrated in FIG. 4A. Since each of the scan chain signature 410A-H is shown as being initialized to a value of "0," each of the exclusive-OR trees 510AE, 510BF, 510CG, 510DH of the space compaction system 500 can initialize the compressed scan chain signature channels 610AE, 610BF, 610CG, 610DH to respectively provide compressed scan chain signatures 611AE, 611BF, 611CG, 611DH each with the value of "0" as shown.

During the first scan cycle, the exclusive-OR tree 510AE can receive the scan chain signature 412A with the value of "1" from the latch circuit 312A and the scan chain signature 412E with the value of "0" from the latch circuit 312E. The exclusive-OR tree 510AE can compress the scan chain signatures 412A, 412E in the manner set forth in more detail above to provide the compressed scan chain signature 612AE with the value of "1" as shown in FIG. 4A. Similarly, the exclusive-OR tree 510AE can receive the scan chain signature 413A with the value of "1" and the scan chain signature 413E with the value of "1" during the second scan cycle. The scan chain signatures 413A, 413E can be compressed by the exclusive-OR tree 510AE to provide the compressed scan chain signature 613AE with the value of "0."

During the scan shifting of responses during test, the latch circuits 312A, 312E continue to sequentially provide the scan chain signatures 410A, 410E to the exclusive-OR tree 510AE, which compresses the scan chain signatures 410A, 410E to form the compressed scan chain signature 610AE, until the eighth scan cycle. The exclusive-OR trees 510BF, 510CG, 510DH likewise can receive and compress the associated pairs of scan chain signatures 410A, 410B, ..., 410H to provide the respective compressed scan chain signatures 610BF, 610CG, 610DH. In the manner set forth above with reference to the sets of scan chain signature bits 411A-H, 412A-H, ..., 419A-H, the compressed scan chain signatures 610AE, 610BF, 610CG, 610DH likewise can be stored in tester memory (or database) system (not shown). The results from subsequent application of the selected test thereby can be compared with the expected values included in the tester memory. Therefore, any erroneous response in the results can be readily identified, and the source of the underlying failure can be diagnosed.

The result of an exemplary subsequent application of the selected test is illustrated in FIG. 4B. In FIG. 4B, the scan chain channels 210A-H include one erroneous response (or value), which appears at scan chain bit 212C in scan chain channel 210C. As shown in FIG. 4A, the scan chain bit 212C has the "good" value of "0;" whereas the scan chain bit 212C illustrated in FIG. 4B has the "bad" (or "erroneous") value of "1." In the manner discussed above with reference to FIG. 4A, the exemplary logic failure diagnosis system 100 can be initialized to a predetermined state such that the multiple-input signature registers 310AD, 310EH provide all zeroes at the output ports of the latch circuits 312A-H. The signature register system 300 thereby can provide an initial scan chain signature 411A-H with the value of "00000000" at the beginning of each test as set forth above.

Once initialized, the signature register system 300 can receive the first set of scan chain bits 211A-H during the first scan cycle as illustrated in FIG. 4B. In the manner discussed above with reference to the first multiple-input signature register 310AD (shown in FIG. 4A), the first multiple-input signature register 310AD can receive the scan chain bits 211A-D with a value of "1111" and provide the scan chain signature 412A-D with a value of "1111" as shown in FIG. 4B. During the second scan cycle, the scan chain bits 212A-D with a value of "0010" are combined with the recirculated scan chain signature 412A-D with a value of "1111" in accordance with the unique recirculation characteristic of the first multiple-input signature register 310AD. The scan chain bits 212A-D, however, include the scan chain bit 212C with the erroneous value of "1" rather than the good value of "0."

As set forth above, the scan chain bits 212A-D with a value of "0010" are provided to the input ports of the respective exclusive-OR circuits 314A-D. The scan chain signature 412A-D with a value of "1111" is recirculated within the first multiple-input signature register 310AD and likewise is provided to the input ports of the respective exclusive-OR circuits 314A-D in accordance with the unique recirculation characteristic of the first multiple-input signature register 310AD. Upon performing the exclusive-OR operations on the respective scan chain bits 212A-D and the scan chain signature 412A-D in accordance with the unique recirculation characteristic, the exclusive-OR circuits 314A-D can provide the results of the exclusive-OR operations to the input ports of the latch circuits 312A-D. The latch circuits 312A-D therefore as illustrated as providing the scan chain signature 413A-D with the erroneous value of "1001" as shown in FIG. 4B rather than the good value of "1011" as illustrated in FIG. 4A. Therefore, the scan signature bit 413C has the erroneous value of "0."

The first multiple-input signature register 310AD continues to receive the scan chain bits 213A-D, 214A-D, ..., 218A-D and to recirculate the scan chain signature 413A-D, including the erroneous value of the scan signature bit 413C, during subsequent scan cycles. The erroneous value of the scan signature bit 413C thereby is recirculated among the scan chain signature channels 410A-D associated with the first multiple-input signature register 310AD. During the third scan cycle, for example, the scan chain signature 414A-D comprises the erroneous value of "0100" as shown in FIG. 4B rather than the good value of "0101" as illustrated in FIG. 4A. The erroneous response therefore has propagated from the scan chain signature channel 410C to the scan chain signature channel 410D. Therefore, the scan signature bit 414C has the good value of "0;" whereas, the scan signature bit 414D has the erroneous value of "1" rather than the good value of "0" as illustrated in FIG. 4A.

During the fourth scan cycle, the erroneous value of the scan signature bit 413C is further recirculated among the scan chain signature channels 410A-D in accordance with the unique recirculation characteristic of the first multiple-input signature register 310AD. Due to the feedback tap 316DB, the erroneous value of the scan signature bit 414D is provided to the exclusive-OR circuit 314A associated with the latch circuits 312A as well as the exclusive-OR circuit 314B associated with the latch circuits 312B. The erroneous response therefore propagates from the scan chain signature channel 410D to the scan chain signature channel 410A and the scan chain signature channel 410B. The scan chain signature 415A-D comprises the erroneous value of "1011" as shown in FIG. 4B rather than the good value of "0111" as illustrated in FIG. 4A. As such, the scan signature bits 415A, 415B each have "erroneous" values. The scan signature bit 415A has the erroneous value of "1;" whereas, the scan signature bit 415B has the erroneous value of "0." As illustrated in FIG. 4B, the erroneous response continues to propagate among the scan chain signature channels 410A-D during subsequent scan cycles in accordance with the unique recirculation characteristic of the first multiple-input signature register 310AD.

Turning to the second multiple-input signature register 310EH, the scan chain bits 211E-H, 212E-H, ..., 218E-H illustrated in FIG. 4B replicate the scan chain bits 211E-H, 212E-H, ..., 218E-H shown in FIG. 4A. Stated somewhat differently, the scan chain bits 211E-H, 212E-H, ..., 218E-H of FIG. 4B do not include any "erroneous" values. The second multiple-input signature register 310EH therefore can receive the scan chain bits 211E-H, 212E-H, ..., 218E-H and provide the scan chain signatures 411E-H, 412E-H, ..., 419E-H in the manner set forth above with reference to FIG. 4A. Since the scan chain bits 211E-H, 212E-H, ..., 218E-H of FIG. 4B do not include any "erroneous" values, no erroneous responses propagate among the scan chain signature channels 410E-H during the test.

A diagnostic system (not shown), such as diagnostic software and/or a diagnostic algorithm, therefore can be applied to compare the compressed scan chain signatures 610AE-610DH provided by the exemplary signature register system 300 and compactor 500 of FIGS. 3A and 4B with the stored expected signatures. The diagnostic software has access only to the data seen by the test equipment, the outputs of the compactor 600, and not the outputs of the multiple-input signature registers 400, so it is not immediately known that one signature register saw no errors. By comparing the expected values against what the tester saw, it is seen that the first error appears on output 610CG after the second shift cycle. Since this compactor output is known to be an XOR of bits 312C and 312G, the diagnostic system knows one of these bits captured an error on cycle two. One shift later, the errors now seen at compactor output 610DH may not be able to distinguish between the possible error sources; however, after the fourth scan shift, because of the different feedback paths in each signature register, the error bits seen on compactor outputs 610AE and 610BF after the fourth cycle (615AE and 615BF) are consistent with the error being originally in latch 312C since if the error was originally caught in latch 312G, either the error should have propagated into latch 312H due to the feedback path and this would have appeared as an error at 610DH instead of 610BF. Since there are two error bit differences, this makes it much more likely that the error bit is within signature register 312A-312D. Confirmation of this occurs upon seeing that all additional errors seen at the compactor outputs 600 on following scan cycles are consistent with what is expected by the error captured in bit 312C on the second cycle. The analysis shows that a single error captured into latch 312C on the second cycle explains all failures seen at the compactor outputs. While it is still possible that an error actually was captured into latch 312G, many additional errors would also have had to have been captured on subsequence shift cycles in order to cancel out all of the errors we expected but were not seen and the errors we saw that were not explained by an error in 312G on the second cycle.

The diagnostic system thereby can identify that the first erroneous value appeared in the scan chain signature channels 410A-D in the scan chain signature channel 410C during the second scan cycle. The scan signature bit 413C therefore is correctly identified as providing the first erroneous value such that the first erroneous value can be traced back to the associated scan chain bit 212C in scan chain channel 210C. Including information regarding the unique recirculation characteristic of each multiple-input signature register 310AD, 310EH, the diagnostic system further can estimate the propagation path traveled by the erroneous value of the scan signature bit 413C during recirculation within the multiple-input signature register 310AD and propagation among the scan chain signature channels 410A-D as discussed in more detail above.

As desired, the diagnostic system can estimate the propagation path traveled by the erroneous value of the scan signature bit 413C by initially assuming that the first erroneous value is the only erroneous value included within the scan chain signature channels 410A-D. In other words, the diagnostic system can initially assume that all "erroneous" values subsequent to the second scan cycle were a result of the erroneous value of the scan signature bit 413C. The diagnostic system can revise this assumption if each subsequent erroneous value cannot be traced back to the erroneous value of the scan signature bit 413C on the second scan cycle. When the sanity check catches an inference flaw, hopefully rare, the analysis can back up through the list of inferences made and make another choice. This backtracking can eventually allow for all possible error bit source locations and eventually one will check out as correct. Having each multiple-input signature register have a unique feedback function and feed to compactor outputs differently (a different mapping of register bits to XOR trees) ensures that as error bits circulate within the signature registers, the errors will appear at the compactor outputs in unique sequences such that it is possible to identify which signature register contains the error.

In cases where there are many error bits that enter the signature registers during a single test, it may be difficult to tell which signature register bits captured the error bits on each cycle. Some of these failing tests may then be identified as un-diagnosable as a result of too much information being lost due to compression. Alternatively, and/or in addition, the logic failure diagnosis system 100 can include a masking system 700 (shown in FIGS. 5A-B) to mask out all but one of the failing multiple-input signature registers 310 after scanning is completed to see which of the signature registers does not contain its expected final value. By cycling through and looking at each signature register in isolation, or by using a binary searching algorithm, it is possible to identify which of the signature registers has an incorrect final state and thus must have captured at least one error bit during the test. Our experimental studies have shown that more than 90% of failures appear in no more than 1 signature register and more than 95% of failures appear in no more than 2 signature registers (this is design dependent but it tends to hold true for most designs since nearby logic scan chains will feed to a common signature register). Once it is known which signature registers captured error bits, it becomes much easier to determine which of those registers capture an error bit on every cycle where new errors appear at the output of the space compactor 500. Also, by observing what the final state is for each failing signature register, we it is possible to confirm all inferences of where the error bits were captured because incorrect inferences will leave the signature registers that are simulated during diagnostic processing in a final state that is not the same as what is observed when using the masking 700. An alternative to having this masking logic 700 is to provide a system (not shown) for scanning out all signature register bits into the tester without disturbing any other scan elements within the design since this also allows inspection of each signature register to determine which ones are not in their correct final state. In some cases where there are so many error bits entering multiple MISRs in several scan cycles that it is impossible to correctly infer where the error bits are captured on each cycle, once it is known which MISRs capture errors, the test can be re-applied and the masking logic 700 can be employed during the scanning operation to capture the scan chain signature channels 410A-H and/or the compressed scan chain signature channels 610AE, 610BF, 610CG, 610DH that are associated with the multiple-input signature register 310 that has not been masked. The test would be re-applied and the mask set to observe each failing signature register in isolation. This will definitively identify which bits of each multiple-input signature register 310 go bad and when. In fact, this is the recommended approach when dumping scan data to the tester is supported since this dumps only the scan chains feeding failed multiple-input signature registers 310 rather than all scan chains 200 in the design. The source of the erroneous value provided by the scan chain bit 212C in scan chain channel 210C from the example shown in FIG. 4B thereby can be identified, and the underlying failure can be diagnosed.

In the manner discussed in more detail above with reference to FIG. 4A, the exemplary logic failure diagnosis system 100 can include a space compaction system 500 (shown in FIG. 3A) for compressing (or combining) the scan chain signatures 411A-H, 412A-H, . . . , 419A-H of the scan chain signature 400 to form the compressed (or composite) scan chain signature 600. Thereby, the scan chain signatures 411A-H, 412A-H, . . . , 419A-H shown in FIG. 4B can be compressed to form the compressed (or composite) scan chain signature channels 610AE, 610BF, 610CG, 610DH. If the space compaction system 500 comprises the exclusive-OR trees 510AE, 510BF, 510CG, 510DH as shown in FIG. 3A, for example, the scan chain signatures 411A-H, 412A-H, . . . , 419A-H can be provided to, and compressed by, the exclusive-OR trees 510AE, 510BF, 510CG, 510DH in the manner set forth above.

The exclusive-OR trees 510AE, 510BF, 510CG, 510DH can be initialized as discussed above to provide the compressed scan chain signature channels 610AE, 610BF, 610CG, 610DH with a value of "0000" as shown in FIG. 4B. During the first scan cycle, the exclusive-OR trees 510AE, 510BF, 510CG, 510DH provide the compressed scan chain signature channels 610AE, 610BF, 610CG, 610DH with a value of "1001" as illustrated in FIG. 4B. The first multiple-input signature register 310AD provides the scan chain signature 413A-D, including the scan signature bit 413C with the erroneous value of "0," during the second scan cycle. In the second scan cycle, the first multiple-input signature register 310AD provides the scan chain signature 413A-D with the value of "1001;" whereas, the second multiple-input signature register 310EH provides the scan chain signature 413E-H with the value of "1111" as illustrated in FIG. 4B. The exclusive-OR trees 510AE, 510BF, 510CG, 510DH compress (or combine) the scan chain signatures 413A-D, 413E-H to provide the compressed scan chain signature channels 613AE, 613BF, 613CG, 613DH in the manner discussed in more detail above. Since the scan signature bit 413C comprises the erroneous value of "0," the compressed scan chain signature channel 613CG includes the erroneous value of "1."

As set forth above, the first multiple-input signature register 310AD recirculates the scan chain signature 413A-D, including the erroneous value of the scan signature bit 413C, during subsequent scan cycles. The erroneous value of the scan signature bit 413C thereby is recirculated by the first multiple-input signature register 310AD and propagates among the scan chain signature channels 410A-D in the manner discussed above. As shown in FIG. 4B, the exclusive-OR trees 510AE, 510BF, 510CG, 510DH continue to receive and compress the scan chain signatures 410A-H to provide the compressed scan chain signature channels 610AE, 610BF, 610CG, 610DH during the subsequent scan cycles in the manner set forth in more detail with reference to FIG. 4A. Therefore, as the erroneous value of the scan signature bit 413C propagates among the scan chain signature channels 410A-D, the erroneous value of the scan signature bit 413C likewise propagates among the compressed scan chain signature channels 610AE, 610BF, 610CG, 610DH as illustrated in FIG. 4B.

During the third scan cycle, for example, the first multiple-input signature register 310AD provides the scan chain signature 414A-D with the value of "0100;" whereas, the second multiple-input signature register 310EH provides the scan chain signature 413E-H with the value of "0111" as illustrated in FIG. 4B. As set forth above, the scan signature bit 414D has the erroneous value of "1" rather than the good value of "0." The exclusive-OR trees 510AE, 510BF, 510CG, 510DH compress the scan chain signatures 414A-D, 414E-H to provide the compressed scan chain signature channels 614AE, 614BF, 614CG, 614DH with the value of "0011" in the manner discussed above. Since the scan signature bit 414D comprises the erroneous value of "1," the compressed scan chain signature channel 613DH includes the erroneous value of "1." The erroneous response therefore propagates from the compressed scan chain signature channel 610CG to the compressed scan chain signature channel 610DH.

Similarly, the scan chain signature 415A-D of the fifth scan cycle comprises the erroneous value of "1011" as shown in FIG. 4B rather than the good value of "0111" as illustrated in FIG. 4A such that the scan signature bits 415A, 415B each have erroneous values. The exclusive-OR trees 510AE, 510BF, 510CG, 510DH compress the scan chain signatures 415A-D, 415E-H to provide the compressed scan chain signature channels 615AE, 615BF, 615CG, 615DH with the value of "1000" in the manner discussed above. As illustrated in FIG. 4A, the good value for the compressed scan chain signature channels 615AE, 615BF, 615CG, 615DH is "0100." Therefore, the compressed scan chain signature channel 615AE has the erroneous value of "1;" whereas, the compressed scan chain signature channel 615BF has the erroneous value of "0." The erroneous response from the compressed scan chain signature channel 614DH has propagated to the compressed scan chain signature channel 615AE and the compressed scan chain signature channel 615BF. As illustrated in FIG. 4B, the erroneous response continues to propagate among the compressed scan chain signature channels 610AE, 610BF, 610CG, 610DH during subsequent scan cycles in accordance with the unique recirculation characteristic of the first multiple-input signature register 310AD.

In the manner discussed above with reference to the scan chain signature channels 410A-H, a diagnostic system (not shown), such as diagnostic software and/or a diagnostic algorithm, can be applied to compare the compressed scan chain signature channels 610AE, 610BF, 610CG, 610DH provided by the exemplary space compaction system 500 (shown in FIG. 3A) with the stored benchmark standard. By comparing the compressed scan chain signature channels 610AE, 610BF, 610CG, 610DH actually seen at the tester with the expected values, the diagnostic system can rapidly determine whether the compressed scan chain signature channels 610AE, 610BF, 610CG, 610DH include any erroneous values. If any erroneous values are identified, the diagnostic system then can determine whether the erroneous values were included with the scan chain signature channels 410A-D provided by the first multiple-input signature register 310AD, included with the scan chain signature channels 410E-H provided by the second multiple-input signature register 310EH, or included with both. The diagnostic system thereafter can analyze any erroneous values in the manner set forth above to identify the source of the erroneous values and diagnose the underlying failure.

Advantageously, the diagnostic resolution of the logic failure diagnosis system 100 can be further enhanced by masking one or more of the multiple-input signature registers 310 from the compressed scan chain signature channels 610. This technique is particularly useful when the scan chain signature channels 410 provided by a large number of multiple-input signature registers 310 are combined to provide a selected compressed scan chain signature channel 610 when testing for defective devices. By masking the scan chain signature channels 410 from the selected compressed scan chain signature channel 610, it becomes possible to tell which of the multiple-input signature registers 310 are contributing to each erroneous response within the selected compressed scan chain signature channel 610.

By recognizing which multiple-input signature registers 310 actually see the erroneous response, diagnostic data collection can be facilitated, and much less data needs to be collected. Even when the compressed internal response bits are not sufficient to perform diagnostics, instead of dumping all internal response bits to the automated test equipment, only the response bits from scan chains 200 feeding the failing multiple-input signature registers 310 need to be collected. This can be a small fraction of the total amount of scan bits 200 from the whole device. Further, by selectively masking specific multiple-input signature registers 310 from the selected compressed scan chain signature channel 610 can be used to help check for partially good devices. If an integrated circuit (or chip) 900 (shown in FIG. 7) is designed with a multiple of logical units, each of which can have its own, independent scan chain signature 400, identifying which units are failing allows for the possibility that some defective units are acceptable.

Figure 5A:
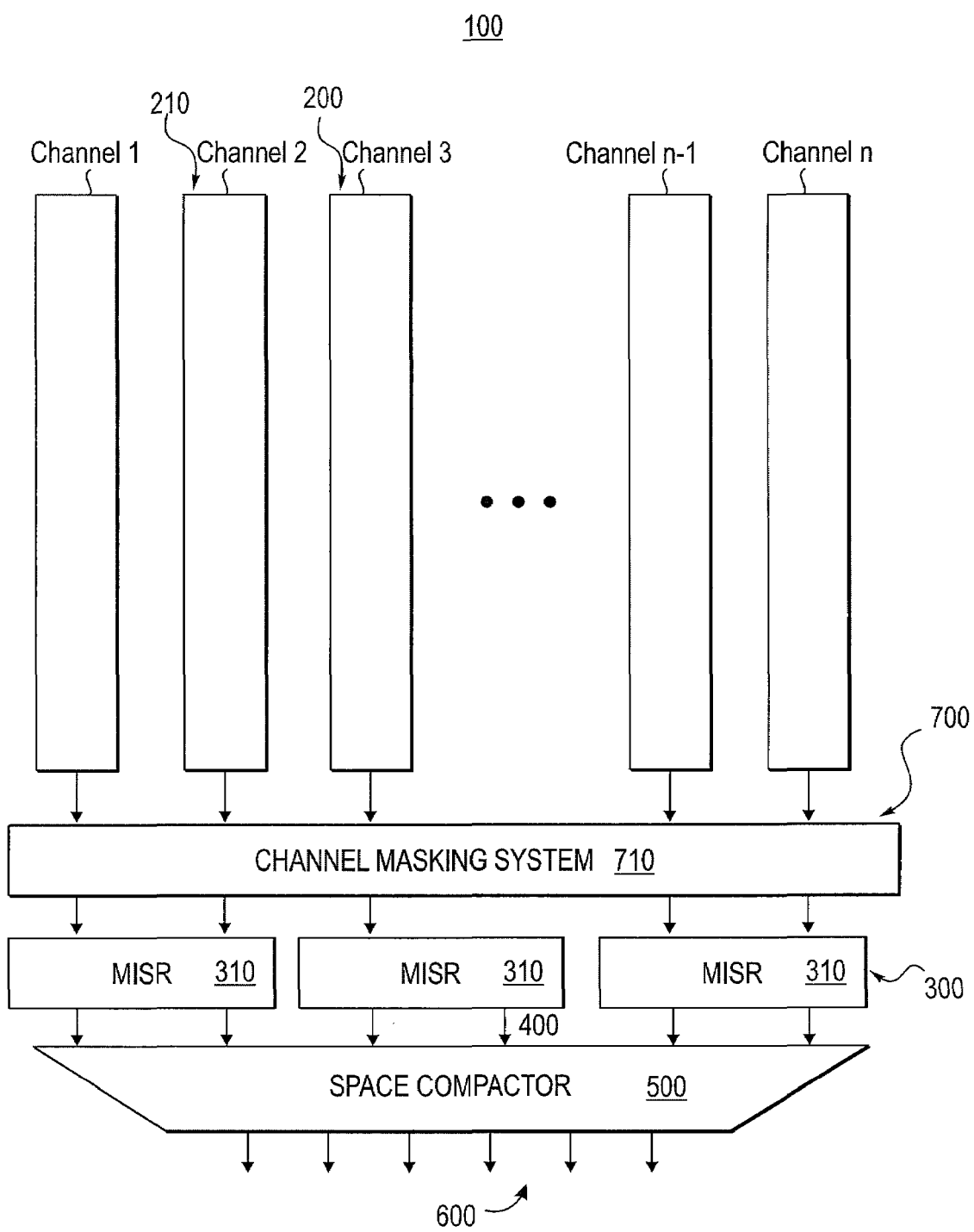
FIG. 5A is an exemplary block diagram illustrating an alternative embodiment of the logic failure diagnosis system of FIG. 2 in which the logic failure diagnosis system includes a channel masking system for inhibiting the signature register system from receiving one or more selected scan chains on selected scan shift cycles.
Figure 5B:
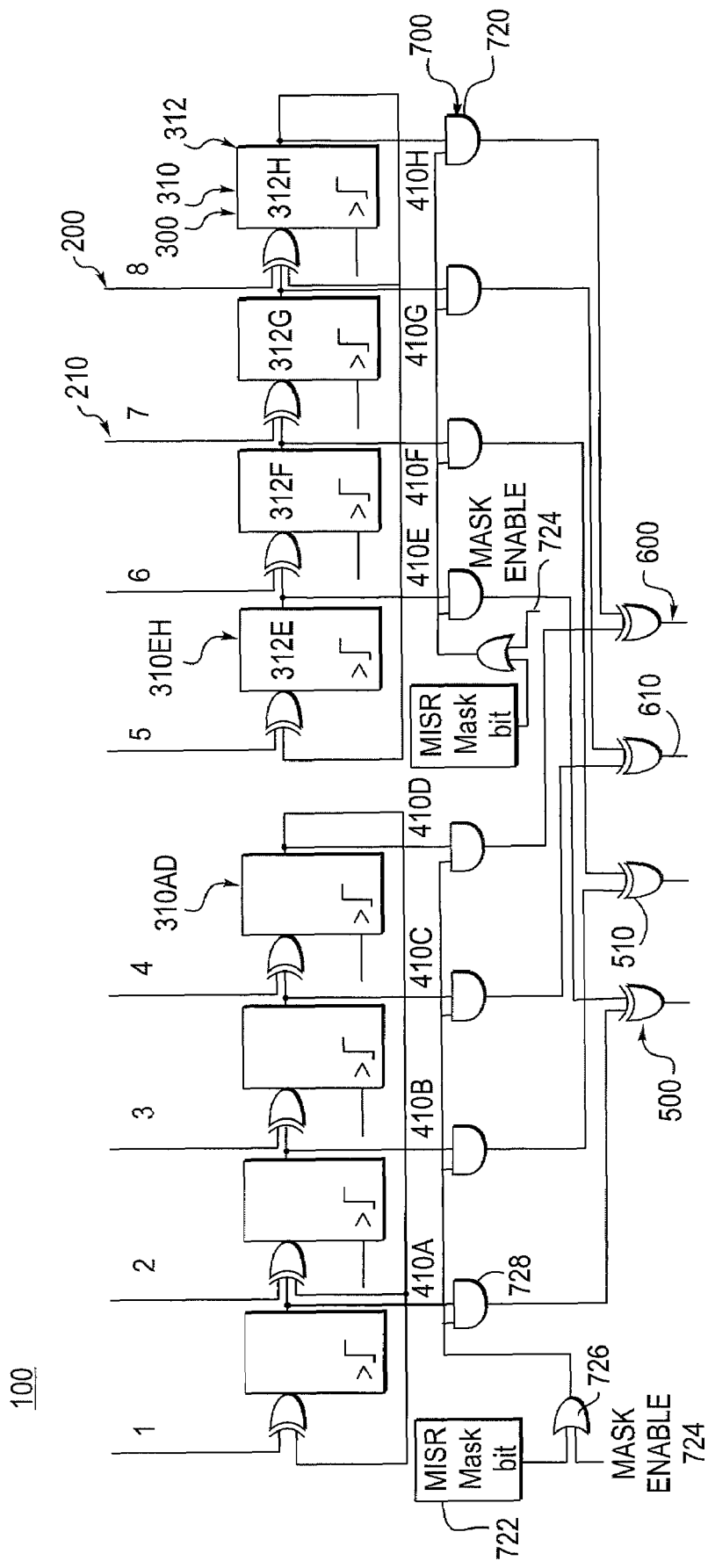
FIG. 5B is an exemplary block diagram illustrating another alternative embodiment of the logic failure diagnosis system of FIG. 2 in which the logic failure diagnosis system includes a register masking system for inhibiting the space compaction system from receiving scan chain signature channels from one or more selected multiple-input signature registers.

In some cases, a device defect can cause a fair number of erroneous responses to appear in several of the scan chain signature channels 410 and/or the compressed scan chain signature channels 610. Since these erroneous responses can simultaneously appear on two or more of the compressed scan chain signature channels 610, the analysis of the erroneous values to identify the source of the erroneous values and diagnose the underlying failure can be much more difficult. The logic failure diagnosis system 100 therefore can advantageously include a masking system 700 as shown in FIGS. 5A-B. The masking system 700 can be provided in any conventional manner and is configured to facilitate the analysis of simultaneous erroneous values by masking one or more scan chain channels 210 and/or scan chain signature channels 410. Thereby, each erroneous value can be analyzed separately from the other erroneous values. An alternative to the masking logic shown in FIG. 5B would be to provide a system (not shown) to allow scanning out to the test equipment the state of all signature register bits (while not disturbing any of the other state elements of the design) so that it is possible to ascertain which signature registers are not in the correct final state; however, while this allows learning of which signature registers captured a failing response bit, it does not allow observation of specific signature registers while scanning.

Turning to FIG. 5A, the masking system 700 is shown as comprising a channel masking system 710 that is disposed between the scan chain channels 210 and the signature register system 300. The channel masking system 710 thereby can inhibit the signature register system 300 from receiving one or more selected scan chain channels 210. Preferably, the channel masking system 710 can substitute a predetermined value for the actual values of the selected scan chain channels 210. By masking the selected scan chain channels 210, the logic failure diagnosis system 100 can advantageously eliminate sources that may provide unpredictable values from the diagnostic analysis. For example, the initial contents of a memory system (not shown) at power-up are unpredictable such that values provided by the memory system at power-up cannot be presumed. The channel masking system 710 therefore can inhibit such unpredictable values in the scan chain channels 210 from being received by the signature register system 300.

Alternatively, and/or in addition, the masking system 700 of the logic failure diagnosis system 100 can include a register masking system 720 as illustrated in FIG. 5B. The register masking system 720 is shown as being disposed between the signature register system 300 and the space compaction system 500. The channel masking system 710, when enabled, can inhibit the space compaction system 500 from receiving the scan chain signature channels 410 from one or more selected multiple-input signature registers 310. Preferably, the register masking system 720 can substitute a predetermined value 722 for the actual values of the masked scan chain signature channels 410. In the example shown in FIG. 5B, the use of AND logic gates for the masking logic substitutes a value of zero (i.e., "0") for each signature register bit when that register is selected to be masked out.

By masking the selected multiple-input signature registers 310, the logic failure diagnosis system 100 can advantageously examine a subset of the multiple-input signature registers 310 separately from the entire signature register system 300. The resultant compressed scan chain signature channels 610 thereby is associated with the scan chain signature channels 410 from the selected subset of the multiple-input signature registers 310, rather than all of the multiple-input signature registers 310. An illustrative register masking system 720 is shown in FIG. 5B as including masking logic system, such as one or more OR gates 726 and/or AND gates 728, for receiving a mask enable signal 724 and masking, in response to the mask enable signal 724, the associated scan chain signature channels 410 with the predetermined value 722.

When there is a failing signature detected at the chip pins, it is not known which of the MISRs contributed the failing bits. By including a masking system for individually and independently masking out MISRs from the XOR trees (shown in FIG. 2), it becomes possible to discover which of the many on-chip MISRs actually contain failing signatures. Those MISRs that match their expected signatures are known to have collected no error bits, so it is not necessary to collect response data from their scan chains for diagnostics. Only the scan chains feeding MISRs with failing signatures need to have their response data collected for diagnostics. This greatly reduces the amount of data needing to be collected for diagnostics.

Furthermore, instead of looking at just the final MISR signature (through a set of XOR trees), it is possible to examine the compressed MISR state after each scan shift cycle and save this data on the tester for later diagnostic processing. By using MISR masking to ensure only MISRs that had failing signatures contributed errors in the data collected, it becomes possible to infer from the sequence of MISR states observed, when an error bit enters a MISR. Also, if each MISR feeds its bits to a different ordering of the MISR Observe chip pins, as the error bit shifts within the MISR it will appear at a different series of MISR Observe pins depending on which MISR it is within. In addition, if each MISR contributing to the compacted MISR output uses a different feedback polynomial, it becomes possible to identify which MISR saw the error bit as well. In many cases it is likely that only a single MISR will fail, so collecting the stream of MISR states from a single MISR will effectively report the incoming state of every scan bit fed into that MISR. In cases where more than two or three MISRs fail, in some cases it may be difficult to correctly infer which MISRs see which error bits on which cycles. In such extreme cases, it is possible to run the test multiple times—each time collecting the response MISR states from one of the failing MISRs. When only two or three MISRs fail, even collecting MISR state sequences for two or three MISRs will typically be less than one tenth of the full response data when there are more than twenty or thirty MISRs. For example, in a chip containing 1 million scan bits, there could be 1024 scan chains of about 1K bits each. Using thirty-two MISRs, each 32-bits in length, will provide compression for all 1024 scan chains. Except for catastrophic errors in the clock trees that cause errors in many disparate locations, most chip failures tend to produce localized failing responses. These localized failing responses tend to be either within a single scan chain or within relatively few (less than twenty) scan chains. In many cases, all failing bits will appear within scan chains feeding the same MISR, but even when this is not the case, it will rarely be more than two or three MISRs (which in the prior example cover sixty-four or ninety-six scan chains through a common region of logic).

In addition to using the MISR masking while observing the composite MISR state during scan-shift operations, the same net effect can be obtained by observing all MISRs during the scan-shift and then, when shifting is complete, using the MISR masking to determine which MISR(s) saw an error. Knowing which MISR(s) saw an error allows a diagnostic software algorithm to infer which scan chains must have contributed to the error in the same manner as described above, because of the linearity of the MISRs and the XOR trees. For example, if only one MISR captured a failing response, the full composite MISR output stream could be compared by the tester to the expected output stream. Where there is a difference, this can be matched to the failing MISR's input scan chains based upon which MISR observation bit(s) fail first and correlating that directly to the scan chain that feeds the corresponding bit of the failing MISR. Also, when each MISR feeds successive bits to different compactor output pins, in many cases it can be inferred which MISR contains an error bit by noting the order of compactor output bits it appears at on different scan cycles. This can be enhanced further by sending each MISR bit to a unique combination of MISR Observe pin XOR trees (a unique pair or triplet of MISR Observe pins).

Further still, when there are multiple failing MISRs, tracking when the failures appear and how they propagate around the feedback paths of each MISR differently (as long as each MISR has a different feedback polynomial), in most cases of multiple MISR failures it should still be possible to identify which MISR saw the failure and thus which scan chain fed the failure to that MISR. The advantage of this approach to unloading the MISR observation stream using the MISR mask is that the tester can store just the single composite MISR observation stream for comparison purposes and does not have to store a dump of the selected MISRs into a tester buffer. Dumping large amounts of data into test buffers is not supported on many older testers. Also note that by observing the full composite MISR stream and then using MISR masking to determine the failing MISRs allows the MISR mask bits to be shared with channel mask bits since they are never used simultaneously; however, the preferred implementation would include MISR mask bits separate from any channel mask bits, although they can be included within the same control register scan chains.

The MISR mask bits can be loaded from the scan-in pins of the chip. The scan-in pins are already known to be contacted by the tester and can supply data for both the scan stimulus as well as for MISR masking. The MISR mask bits (one per individual MISR) can be shared with any channel masking bits that may also be on the device, unless MISR masking is needed on a scan cycle by scan cycle basis. Channel masking allows masking of response bits before they enter the MISR whereas MISR masking prevents the compressed MISR signatures from being observed in a composite signature at the chip pins. MISR masking can also be used to augment channel masking by masking out a specific set of MISRs known to have collected an unpredictable response. Instead of trying to use the channel masking facility to mask out a large number of unknown responses, MISR masking provides an alternative approach that can prove useful in certain cases. By ignoring certain MISRs, it is like masking out all of the channels that feed those MISRs on every scan cycle, without consuming any of the channel masking resources. This allows the limited channel masking resource to be focused on those channels feeding MISRs not being masked out. Note that if MISR masking is used to perform masking of unknowns, the MISR mask bits cannot be shared with channel mask bits if MISRs will be observed while scanning as was described above to aid in diagnostics.

Figure 6B:
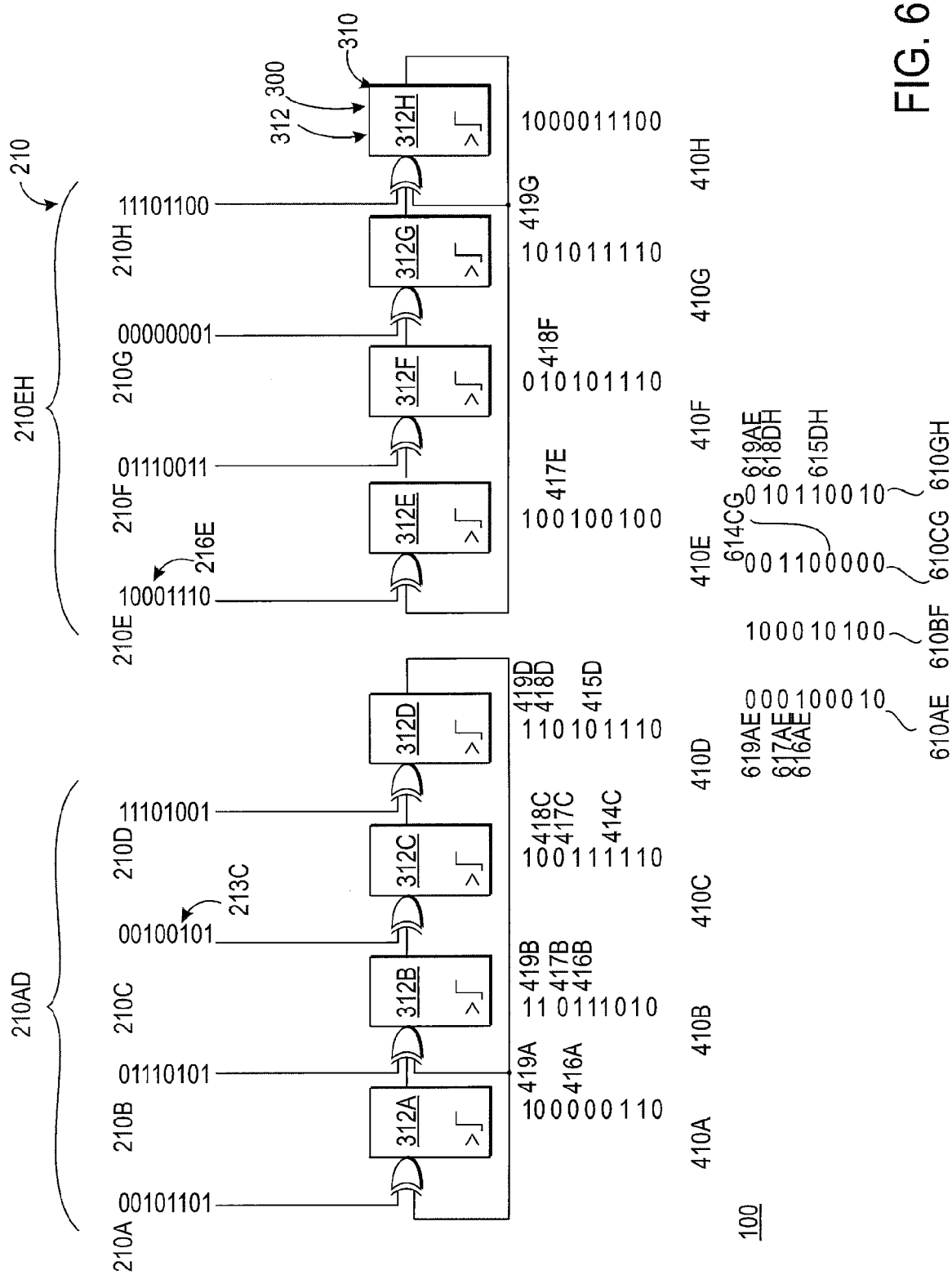
FIG. 6B is an exemplary diagram illustrating the operation of the logic failure diagnosis system of FIG. 6A in which the error bits are provided to different multiple-input signature registers.

FIGS. 6A-B provide additional examples to illustrate the operation of the logic failure diagnosis system 100 of FIG. 3A. More particularly, the examples of FIGS. 4C-D illustrate the operation of the logic failure diagnosis system 100 when the scan chain channels 210A-H include two erroneous responses (or values). Turning to FIG. 4C, for example, the two erroneous values appear in the scan chain channels 210AD associated with the first multiple-input signature register 310AD. The scan chain bit 213C of the third scan cycle has the erroneous value of "1" as shown in FIG. 4C rather than the good value of "0" as illustrated in FIG. 4A; whereas, the scan chain bit 216A of the sixth scan cycle is shown as having the erroneous value of "0" instead of the good value of "1." In other words, the erroneous values appear in two different scan chain channels 210A, 210C that feed the same multiple-input signature register 310.

The failure diagnosis system 100 can process the scan chain channels 210A-H as set forth in more detail above with reference to FIGS. 4A-B to provide the scan chain signature channels 410A-H and/or the compressed scan chain signature channels 610AE, 610BF, 610CG, 610DH. The erroneous values of the scan chain bits 213C, 216A likewise will appear and propagate among the scan chain signature channels 410A-H and/or the compressed scan chain signature channels 610AE, 610BF, 610CG, 610DH in the manner discussed above. A diagnostic system (not shown), such as diagnostic software and/or a diagnostic algorithm, likewise can be applied to compare the scan chain signature channels 410A-H and/or the compressed scan chain signature channels 610AE, 610BF, 610CG, 610DH of FIG. 4C with the stored benchmark standard.

Since the first erroneous value encountered by the failure diagnosis system 100 is associated with the scan chain bit 213C, the diagnostic system can initially assume that the scan chain bit 213C has the only erroneous value in the scan chain channels 210A-H. The diagnostic system likewise can identify that the scan chain bit 213C is included among the scan chain channels 210AD associated with the first multiple-input signature register 310AD. Therefore, the diagnostic system can trace the propagation of the erroneous value of the scan chain bit 213C in accordance with the unique recirculation characteristic of the first multiple-input signature register 310AD. While examining the scan chain channels 210A-H, the diagnostic system encounters the erroneous value of the scan chain bit 216A during the sixth scan cycle.

The diagnostic system can identify that the scan chain bit 216A, like the scan chain bit 213C, is included among the scan chain channels 210AD associated with the first multiple-input signature register 310AD. The diagnostic system thereby can continue to trace the propagation of the erroneous value of the scan chain bit 213C while also tracing, and accounting for, the propagation of the erroneous value of the scan chain bit 216A. By tracing the propagation of the erroneous values of the scan chain bits 213C, 216A, the diagnostic system can confirm that all erroneous values can be attributed to the scan chain bits 213C, 216A. Thereby, the diagnostic system can identify the source of the erroneous values and diagnose the underlying failure in the manner set forth above.

The exemplary scan chain channels 210A-H shown in FIG. 4D likewise include two erroneous responses (or values). In FIG. 4D, the first erroneous value appears in the scan chain channels 210AD associated with the first multiple-input signature register 310AD; whereas, the second erroneous value is included in the scan chain channels 210EH associated with the second multiple-input signature register 310EH. The scan chain bit 213C of the third scan cycle has the erroneous value of "1" as shown in FIG. 4D rather than the good value of "0" as illustrated in FIG. 4A; whereas, the scan chain bit 216E of the sixth scan cycle is shown as having the erroneous value of "0" instead of the good value of "1." In other words, the erroneous values appear in the scan chain channels 210A, 210E that feed the different multiple-input signature registers 310.

The failure diagnosis system 100 can process the scan chain channels 210A-H as set forth in more detail above with reference to FIGS. 4C to provide the scan chain signature channels 410A-H and/or the compressed scan chain signature channels 610AE, 610BF, 610CG, 610DH. The erroneous values of the scan chain bits 213C, 216E likewise will appear and propagate among the scan chain signature channels 410A-H and/or the compressed scan chain signature channels 610AE, 610BF, 610CG, 610DH in the manner discussed above. The diagnostic system likewise can be applied to compare the scan chain signature channels 410A-H and/or the compressed scan chain signature channels 610AE, 610BF, 610CG, 610DH of FIG. 4C with the stored benchmark standard as discussed above.

The erroneous value appears at the compressed scan chain signature channel 614CG during the third scan cycle and could appear at the compressed scan chain signature channel 614CG from either the first multiple-input signature register 310AD or the second multiple-input signature register 310EH. In other words, the erroneous value of the compressed scan chain signature channel 614CG could result from an erroneous value in the scan chain signature 414C or an erroneous value in the scan chain signature 414G. During subsequent scan cycles, the erroneous value will recirculate within the relevant multiple-input signature register 310AD, 310EH and, since each multiple-input signature register 310AD, 310EH has unique recirculation characteristic, it is possible to infer which multiple-input signature register 310AD, 310EH provided the scan chain signature 414C, 414G with the erroneous value. By examining the manner by which the erroneous value of the compressed scan chain signature channel 614CG propagates among the compressed scan chain signature channels 610AE, 610BF, 610CG, 610DH, the diagnostic system can determine that the erroneous value of the compressed scan chain signature channel 614CG resulted from an erroneous value in the scan chain signature 414C.

In the manner set forth above, the diagnostic system can assume that, since the scan chain signature 414C included an erroneous value, any subsequent erroneous values in the compressed scan chain signature channels 610AE, 610BF, 610CG, 610DH likely are a result of a subsequent erroneous value in the scan chain signature channels 410E-H provided by the second multiple-input signature register 310EH. The diagnostic system encounters the erroneous value of the compressed scan chain signature channel 617AE. The erroneous value could appear at the compressed scan chain signature channel 617AE from either the first multiple-input signature register 310AD or the second multiple-input signature register 310EH in the manner discussed above. Based upon the above assumption, the diagnostic system can assume that the erroneous value of the compressed scan chain signature channel 614CG is a result from an erroneous value in the scan chain signature 417E provided by the second multiple-input signature register 310EH as shown in FIG. 6B. This assumption explains the remaining erroneous values in the compressed scan chain signature channels 610AE, 610BF, 610CG, 610DH. Therefore, each erroneous value in the compressed scan chain signature channels 610AE, 610BF, 610CG, 610DH can be explained by the first erroneous value of the scan chain signature 414C and the second erroneous value of the scan chain signature 417E.

The diagnostic system therefore can trace the erroneous values of the scan chain signatures 414C, 417E to the scan chain bits 213C, 216E in the manner discussed above. Thereby, the diagnostic system can identify the source of the erroneous values and diagnose the underlying failure in the manner set forth above. Note that the scan chain bits 213C, 216E explain the erroneous values in the compressed scan chain signature channels 610AE, 610BF, 610CG, 610DH and the erroneous values in the scan chain signature channels 410A-H; otherwise, the scan chain bits 213C, 216E are not the correct sources of the erroneous values. The diagnostic system to perform this implication can use this check to catch cases where additional erroneous values enter the multiple-input signature registers 310 such that one or more of the above assumptions are not valid.

Another problem addressed by the various embodiments described herein is that of dealing with integrated circuit (or chip) designs that allow for some portion of the device to be defective yet still be able to sell the device. This is often called a "partial good" methodology. By using signature register systems 300 to capture independent responses from chip units, some number of which are allowed to be defective, masking can be utilized to identify which units within the integrated circuit are defective and a decision can be made on whether the device still has merit. This does require a rigorous design methodology that ensures each unit that is allowed to be defective is fully isolated so that errors from such units cannot propagate to other logic or other units. Given such unit isolation during testing, the ability to check individual signatures for each unit provides the mechanism to handle a partial-good device manufacturing test methodology.

Figure 7:
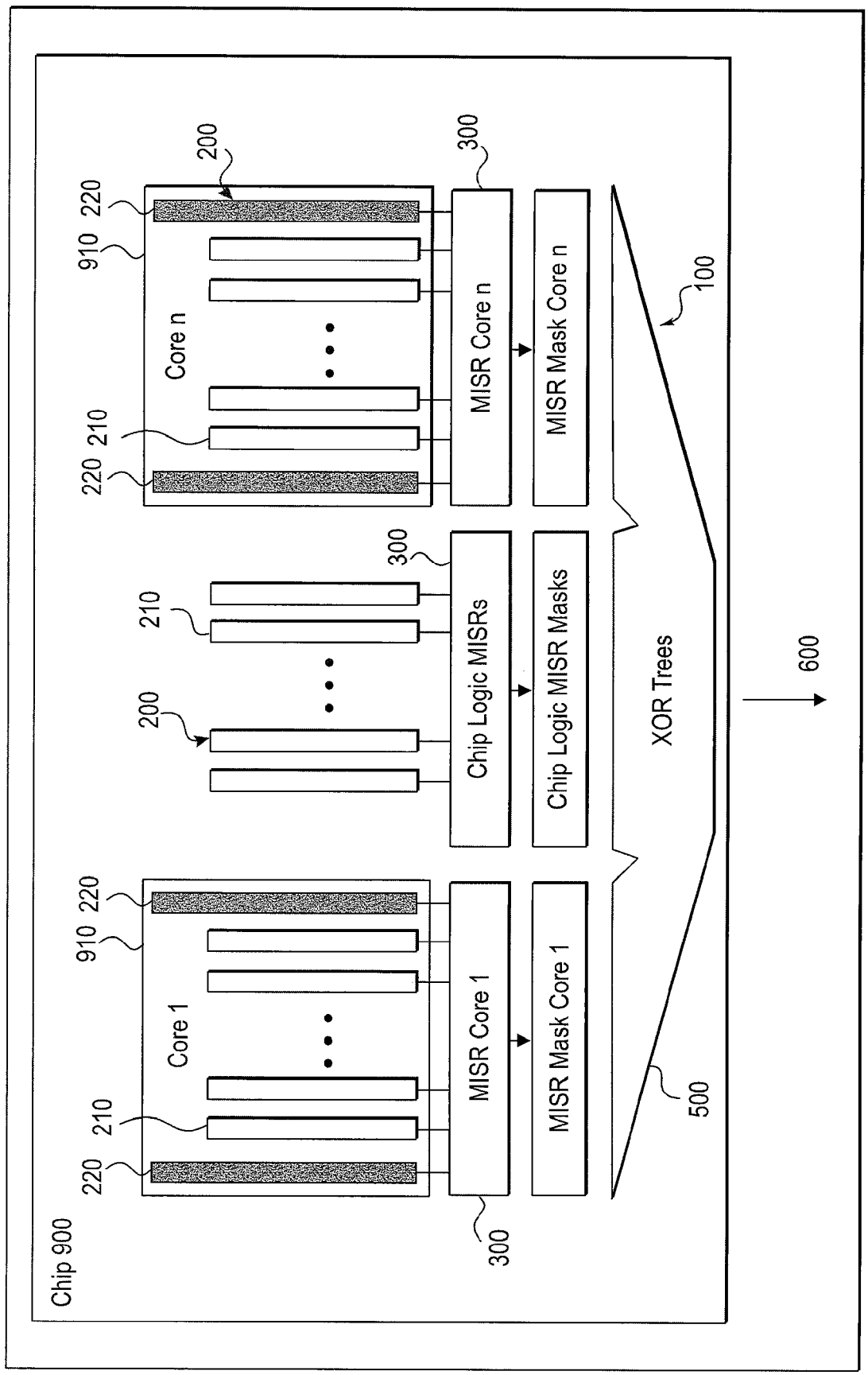
FIG. 7 is an exemplary block diagram illustrating an alternative embodiment of the logic failure diagnosis system of FIG. 2 in which the logic failure diagnosis system is disposed on an integrated circuit and configured to support a partially-good die program.

FIG. 7 shows how an integrated circuit (or chip) 900 with multiple identical cores 910 might be configured to support a partially good die program. Each core 910 that is allowed to be defective (called an expendable core) is designed with an internal boundary scan to avoid the core 910 from accepting values from outside the core 910 and to avoid other logic from receiving signals from the core 910. In FIG. 7, the scan chains (or channels) 220 shown on each side of the cores 910 are designated as the boundary registers and boundary logic. If the associated core 910 is bad, we do not want it to contaminate the results seen by other logic and cores 910; nor do we want the core 910 to receive bad data from elsewhere that could result in incorrect values scanning out from the scan chains (or channels) of the core 910.

Alternatively and/or in addition to having each expendable core 910 implement a boundary scan to isolate it from surrounding logic, these cores 910 must feed their scan outputs to their own dedicated signature register system 300. In the manner discussed in more detail above with reference to FIGS. 1 and 2, each signature register system 300 preferably comprises a multiple-input signature register (MISR) system and can comprise any suitable number of multiple-input signature registers 310 (shown in FIG. 2). By using signature register systems 300 dedicated to each expendable core 910, it is possible to use masking to ignore the results from any core 910 once it is known to be defective. It also allows a rapid identification of failures to specific cores 910. If a failure occurs in a signature register system 300 not associated with an expendable core 910, the integrated circuit 900 fails and is unusable.

If a failure occurs in a signature register system 300 associated with an expendable core 910, if the number of failed expendable cores 910 exceeds some preselected limit, the integrated circuit 900 fails and is discarded; if the number of failed expendable cores 910 is within the allowed limit, the masking of the signature register system 300 can be configured to ensure all known defective expendable cores 910 have the results of their associated signature register system 300 masked out. This could be done either dynamically during production testing and binning, or all integrated circuits 900 that fail only within expendable cores 910 could be tested again offline to determine how many cores 910 fail and to what partial-good bin they belong.

The invention is susceptible to various modifications and alternative forms, and specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives.

What is claimed is:

1. A system adapted for performing failure diagnosis, comprising:
a signature register system sequentially receiving a set of data values and providing a set of data signature values during each of a plurality of clock cycles, said signature register system internally recirculating the set of data signature values in accordance with a unique recirculation characteristic to provide a set of recirculated data values and combining the set of data values and the set of recirculated data values for a selected clock cycle to provide the set of data signature values for the next clock cycle; and
a space compaction system compressing the sets of data signature values to provide sets of compressed signature values,
wherein the sets of compressed signature values are compared with sets of expected signature values to determine whether the sets of compressed signature values include one or more erroneous values and to identify a source of the erroneous values.

2. The system of claim 1, wherein said signature register system includes a plurality of multiple-input signature registers each receiving a predetermined portion of the set of data values and providing a predetermined portion of the set of data signature values.

3. The system of claim 2, wherein each of said multiple-input signature registers internally recirculates the predetermined portion of the set of data values in accordance with a preselected recirculation characteristic.

4. The system of claim 3, wherein said preselected recirculation characteristic for each of said multiple-input signature registers is unique.

5. The system of claim 2, wherein said space compaction system receives the predetermined portions provided by the multiple-input signature registers and combines the predetermined portions to provide the sets of compressed signature values.

6. The system of claim 1, wherein said space compaction system comprises a plurality of exclusive-OR trees.

7. The system of claim 1, further comprising a masking system that can inhibit at least one selected data value in each of the set of data values from being received by said signature register system.

8. The system of claim 7, wherein said masking system replaces the at least one selected data value with a predetermined value.

9. The system of claim 1, further comprising a masking system that can inhibit at least one selected data signature value in each of the set of data signature values from being received by said space compaction system.

10. The system of claim 9, wherein said masking system replaces the at least one selected data signature value with a predetermined value.

11. The system of claim 1, further comprising a memory system that stores the sets of expected signature values and a diagnostic system that compares the sets of compressed signature values with the sets of expected signature values and to diagnose the source of the erroneous values.

12. A method for performing failure diagnosis, comprising:
- sequentially receiving a set of data values and providing a set of data signature values during each of a plurality of clock cycles;
- internally recirculating the set of data signature values in accordance with a unique recirculation characteristic to provide a set of recirculated data values;
- combining the set of data values and the set of recirculated data values for a selected clock cycle to provide the set of data signature values for the next clock cycle;
- compressing the sets of data signature values to provide sets of compressed signature values;
- comparing the sets of compressed signature values with a set of expected signature values; and
- identifying a source of the erroneous values if the sets of compressed signature values include one or more erroneous values.

13. The method of claim 12, wherein said receiving a set of data values includes masking at least one of the data values.

14. The method of claim 12, wherein said compressing the sets of data signature values includes masking at least one of the data signature values.

15. The method of claim 12, wherein said receiving the set of data values includes dividing the set of data values into a plurality of data value subsets, said providing the set of data signature values includes providing the set of data signature values as a plurality of data signature value subsets each being associated with one of the data value subsets, said internally recirculating the set of data signature values comprises internally recirculating each of the data signature value subsets, and said combining the set of data values and the set of recirculated data values comprises combining at least one of the data signature value subsets with the associated data value subset.

16. The method of claim 15, wherein said combining the set of data values and the set of recirculated data values comprises combining each of the data signature value subsets with the associated data value subset.

17. The method of claim 15, wherein said internally recirculating each of the data signature value subsets comprises internally recirculating each of the data signature value subsets in accordance with a preselected recirculation characteristic.

18. The method of claim 17, wherein said preselected recirculation characteristic is unique for each of the data signature value subsets.

19. The method of claim 15, wherein said compressing the sets of data signature values includes combining at least one of the data signature value subsets with a predetermined value.

20. The method of claim 15, wherein said compressing the sets of data signature values includes combining each of the data signature value subsets.

21. A system adapted for performing failure diagnosis, comprising:
- a signature register system that includes a plurality of multiple-input signature registers, said multiple-input signature registers each sequentially receiving sets of incoming data values and providing sets of data signature values during a plurality of clock signal cycles, each of said multiple-input signature registers internally recirculating the data signature values in accordance with a unique recirculation characteristic to provide recirculated data values and combining the incoming data values with the recirculated data values for a selected clock signal cycle to provide the data signature values for the next clock signal cycle; and
- a space compaction system that receives the data signature values from each of said multiple-input signature registers and that compresses the data signature values to provide compressed signature values,
- wherein the compressed signature values are compared with expected compressed signature values to determine whether the compressed signature values include an erroneous value and to identify a source of the erroneous value.

22. The system of claim 21, wherein said multiple-input signature registers each comprise a plurality of latch circuits provided in a ring configuration and synchronized via a common clock signal, and wherein said latch circuits include input ports that receive the incoming data values and output ports that provide the data signature values.

23. The system of claim 22, wherein a selected multiple-input signature register further includes a feedback tap that configures said unique recirculation characteristic of said selected multiple-input signature register, said feedback tap forming a sub-ring configuration within said ring configuration.

* * * * *